United States Patent
Kim et al.

(10) Patent No.: US 10,978,659 B2
(45) Date of Patent: Apr. 13, 2021

(54) INORGANIC ILLUMINANT, LIGHT-EMITTING DIODE AND LIGHT-EMITTING DEVICE HAVING THEREOF

(71) Applicant: LG Display Co., Ltd., Seoul (KR)

(72) Inventors: Byung-Geol Kim, Paju-si (KR); Sung-Il Woo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 74 days.

(21) Appl. No.: 16/600,019

(22) Filed: Oct. 11, 2019

(65) Prior Publication Data
US 2020/0119298 A1   Apr. 16, 2020

(30) Foreign Application Priority Data
Oct. 12, 2018   (KR) .................. 10-2018-0121670

(51) Int. Cl.
| H01L 27/15 | (2006.01) |
| H01L 29/26 | (2006.01) |
| H01L 31/12 | (2006.01) |
| H01L 33/00 | (2010.01) |
| H01L 51/50 | (2006.01) |
| H01L 51/00 | (2006.01) |

(52) U.S. Cl.
CPC ........ *H01L 51/502* (2013.01); *H01L 51/0072* (2013.01); *H01L 51/0081* (2013.01); *H01L 51/0092* (2013.01); *H01L 51/5036* (2013.01)

(58) Field of Classification Search
USPC ..... 257/79, E51.044, 40, 102, E51.041, 103, 257/E21.007, E21.053, E21.266, E21.32, 257/E21.352, E33.001, 643, 347
See application file for complete search history.

(56) References Cited

U.S. PATENT DOCUMENTS

2012/0217868 A1*   8/2012   Ma ................... H01L 51/0085
                                                    313/504

OTHER PUBLICATIONS

Shun-Chieh Hsu, et al, "Highly Stable and Efficient Hybrid Quantum Dot Light-Emitting Diodes", IEEE Photonics Journal, An IEEE Photonics Society Publication, Open Access, vol. 7, No. 5, Oct. 2015.

\* cited by examiner

*Primary Examiner* — Niki H Nguyen
(74) *Attorney, Agent, or Firm* — Polsinelli PC

(57) ABSTRACT

The present disclosure relates to a illuminant comprising an inorganic luminescent particle having at least one metal component on a surface thereof, and an (iso) quinoline-based ligand coordinated to the at least one metal component, a light-emitting diode and a light-emitting device including the illuminant in an emitting material layer (EML). The illuminant enables white luminescence in the light-emitting diode with only single emissive unit.

23 Claims, 15 Drawing Sheets

310
(Red Light Emission)

300
(Red+Blue+Green Light Emission)
→ White Light Emission

INORGANIC ILLUMINANT, LIGHT-EMITTING DIODE AND LIGHT-EMITTING DEVICE HAVING THEREOF

CROSS REFERENCE TO RELATED APPLICATION

This application claims the benefit under 35 U.S.C. § 119(a) of Korean Patent Application No. 10-2018-0121670, filed in the Republic of Korea on Oct. 12, 2018, which is hereby incorporated by reference in its entirety.

BACKGROUND

Field of the Disclosure

The present disclosure relates to an illuminant, and more specifically, to an inorganic illuminant that can implement white luminescence, and light-emitting diode and light-emitting device including the same.

Description of the Background

As electronic and information technologies progress, a field of displays for processing and displaying a large quantity of information has been developed rapidly. Accordingly, various flat panel display devices such as a liquid crystal display (LCD) device, an organic light-emitting diode (OLED) display device, etc. have been developed. Among these flat panel display devices, OLED has come into spotlight as a next-generation display device replacing LCD since it enables thin structure and shows lower consumption power.

In case of increasing current densities or raising driving voltages in the OLED for improving luminance in OLED display device, the luminous life time of OLED become shorter owing to thermal degradation and deteriorations of organic materials in OLED. Besides, OLED has not achieved high color gamut required in ITU-R Recommendation BT.2020 (REC. 2020 or BT.2020) of International Telecommunication Union as regards 4K/UHD standards.

Recently, a display device using inorganic luminescent particles such as quantum dot (QD) has been developed. QD is an inorganic luminescent particle that emits light as unstable stated excitons drop from conduction band to valence band. QD has large extinction coefficient, high quantum yield among inorganic particles and generates strong fluorescence. Besides, since QD has different luminescence wavelengths as its sizes, it is possible to obtain light within the whole visible light spectra so as to implement various colors by adjusting sizes of QD.

In case of using QD as a luminous material in an emitting material layer (EML), it is possible to enhance color purity of individual pixel and implement white (W) light consisting of high purity red (R), green (G) and blue (B) so as to achieve Rec.2000 standard. Accordingly, Quantum Dot Light-Emitting Diode (QLED) which uses QD as luminous material has come into spotlight.

Both OLED and QLED includes an anode and a cathode, an emitting material layer (EML) between the anode and the cathode, a hole injection layer (HIL) and a hole transport layer (HTL) between the cathode and EML and an electron transport layer (ETL) between the cathode and EML, and optionally an electron injection layer (EIL) is located between the cathode and ETL.

EML, which is an essential layer in OLED and QLED, includes luminescent material emitting red, green or blue. Each pixel region can emit red, green or blue (B) light with a single emissive unit. However, OLED and QLED should have tandem structure consisting of laminated multiple emissive units in order to implement white (W) light emission. The tandem-structured OLED and QLED should have multiple common layers for injection and transportation of charges and at least two EML (e.g. combination of blue EML and YG EML). Since it is necessary to have multiple emissive units, the driving voltage in the tandem-structured OLED and QLED is raised rapidly.

Such a high driving voltage applied into the tandem-structured OLED and QLED causes much Joule' heat to be generated, and the generated Joule's heat acts as stress to organic and inorganic materials of OLED and QLED. As the material in OLED and QLED deteriorates, the luminous life span of OLED and QLED decreases rapidly. Also, tandem-structured OLED and QLED increases manufacturing cost exponentially and decreases production yield rapidly.

SUMMARY

Accordingly, the present disclosure is directed to an inorganic illuminant, a light-emitting diode and a light-emitting device including the illuminant that substantially obviates one or more of the problems due to the limitations and disadvantages of the related art.

The present disclosure also provides an inorganic illuminant designed in order to implement white luminescence with ease, and a light-emitting diode and a light-emitting device including the illuminant.

Further, the present disclosure provides an inorganic illuminant that can implement low driving voltage and enhance luminous life span of the diode, a light-emitting diode and a light-emitting device applying the illuminant.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

According to an aspect, the present disclosure provides an illuminant comprising an inorganic luminescent particle having at least one metal component on a surface thereof, and an (iso) quinoline-based ligand coordinated to the at least one metal component.

As an example, the inorganic luminescent may comprise a core, a shell enclosing the core, and optionally a coating enclosing the shell.

Each of the core and the shell may comprise an inorganic material selected from the group semiconductor nanocrystals such as Group II-IV compound semiconductor nanocrystals, Group III-V compound semiconductor nanocrystals, Group IV-VI compound semiconductor nanocrystals, Group I-III-VI compound semiconductor nanocrystals and combination thereof and/or metal oxide nanoparticles.

The at least one metal component may comprise zinc (Zn), magnesium (Mg), cadmium (Cd), calcium (Ca) and or aluminum (Al).

The inorganic luminescent particle may emit red (R), green (G) or Blue (B) light, while a moiety of the at least one metal component coordinated to the ligand may emit green (G) and/or blue (B) light.

According to another aspect, the present disclosure provides a light-emitting diode including the illuminant in an emitting material layer.

For example, the light-emitting diode can emit white (W) light.

According to still another aspect, the present disclosure provides a light-emitting device including the illuminant in an emitting material layer.

For example, the light-emitting device may comprise a light-emitting diode display device and a light-emitting diode illumination device.

It is to be understood that both the foregoing general description and the following detailed description are examples and are explanatory and are intended to provide further explanation of the disclosure as claimed.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of aspects of the disclosure.

In the drawings:

FIG. 2 illustrates a state of implementing white luminescence as a moiety of the metal component and an (iso) quinoline-based ligand coordinated to the metal component emits blue (B) light. FIG. 3 illustrates a state of implementing white luminescence as a moiety of the metal component and (iso) quinoline-based ligand coordinated to the metal component emits green (G) light;

FIG. 5 illustrates a state of implementing white luminescence as a moiety of the metal component and an (iso) quinoline-based ligand coordinated to the metal component emits blue (B) light. FIG. 6 illustrates a state of implementing white luminescence as a moiety of the metal component and (iso) quinoline-based ligands coordinated to the metal component emits green (G) light;

FIG. 8 illustrates a state of implementing white luminescence as a moiety of the metal components and an (iso) quinoline-based ligand coordinated to the metal component emits blue and green (G) lights;

DETAILED DESCRIPTION

Inorganic Illuminant

An illuminant of the present disclosure includes an inorganic luminescent particle having at least one metal component on a surface thereof, and an (iso) quinoline-based ligand coordinated to the at least one metal component. A moiety of the at least one metal component coordinated to the (iso) quinoline-based ligand emits light of particular wavelengths. As used herein, the term "(iso) quinoline-based ligand" or "(iso) quinoline compound" indicates anyone of "quinoline-based ligand/compound" and "isoquinoline-based ligand/compound". Various illuminants may be synthesized as a structure of the inorganic luminescent particle.

Figure 1:
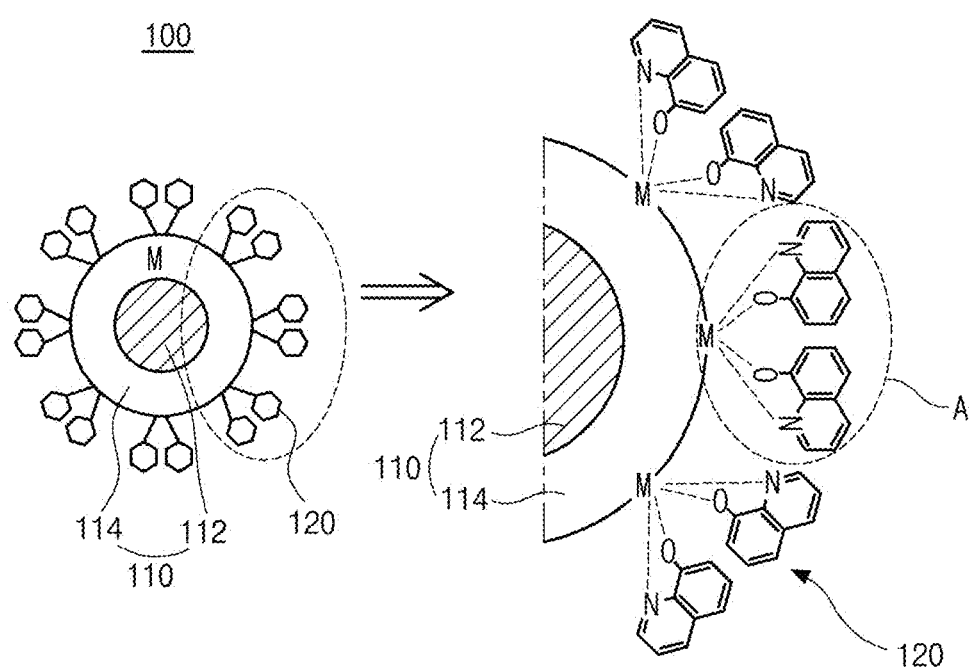
FIG. 1 is a schematic diagram illustrating an illuminant comprising an inorganic luminescent particle including a core and a shell and having a metal component on a surface thereof, and an (iso) quinoline-based ligand coordinated to the metal component in accordance with an exemplary aspect of the present disclosure. 8-hydroxyquinole (HQ) as an (iso) quinoline-based ligand is illustrated.

FIG. 1 is a schematic diagram illustrating an illuminant comprising an inorganic luminescent particle including a core and a shell and having a metal component on a surface thereof, and an (iso) quinoline-based ligand coordinated to the metal component. in accordance with an exemplary aspect of the present disclosure. As illustrated in FIG. 1, an illuminant 100 in accordance with a first aspect comprises an inorganic luminescent particle 110 having a metal component "M" on a surface thereof, and an (iso) quinoline-based ligand 120 coordinated to the metal component "M".

In one aspect, the inorganic luminescent particle 110 may comprise inorganic luminescent nanoparticles such as a quantum dot (QD) or a quantum rod (QR). QD or QR is inorganic luminescent nanoparticles that emit light as unstable stated excitons drop from conduction band energy level to valence band energy level. Such inorganic luminescent nanoparticles have large extinction coefficient, high quantum yield among inorganic particles and generates strong fluorescence. Besides, since QD or QR have different luminescence wavelengths as its sizes, it is possible to obtain light within the whole visible light spectra so as to implement various colors by adjusting its sizes.

In one exemplary aspect, the QD or QR may have single structure. Alternatively, the QD or QR may have a have a heterologous structure including a core 112 and a shell 110 enclosing the core 112 so as to protect the core 112. The ligand 120 is coordinated with the metal component "M" on a surface of the shell 114.

In an aspect, each of the core 112 and the shell 114 may have a single layered core and a single layered shell, respectively. Alternatively, each of the core 112 and the shell 114 may have multiple layered cores and multiple layered shells, respectively. The reactivity of precursors forming the core 112 and/or 114 and injection rates of the precursors into a reaction vessel may have affects upon the growth degrees, crystal structures and energy bandgaps of such inorganic luminescent nanoparticles, and therefore, it is possible to emit lights of various wavelength ranges by adjusting energy bandgap thereof.

In an exemplary aspect, the organic luminescent particle 110 (e.g. QD or QR) may have a type-I core/shell structure where the energy bandgap of the core 112 is within the energy bandgap of the shell 114. In case of using the type I core/shell structure, electrons and holes are transferred to the core 112 and recombined in the core 112. Since the core 112 emits light from exciton energies, it is possible to adjust luminance wavelengths by adjusting sizes of the core 112.

In another exemplary aspect, the inorganic luminescent particle 110 (e.g. QD or QR) may have type-I core/shell structure where the energy bandgaps of the core 112 and the shell 114 are staggered and electrons are holes are transferred to opposite directions among the core 112 and the shell 114. In case of using the type I core/shell structure, it is possible to adjust luminescence wavelengths as the thickness and the energy bandgap locations of the shell 114.

In still another exemplary aspect, the inorganic luminescent particle 110 (e.g. QD or QR) may have reverse type I core/shell structure where the energy bandgap of the core 112 is wider than that of the shell 114. In case of using the reverse type I core/shell structure, it is possible to adjust luminescence wavelengths as thickness of the shell 114.

As an example, when the inorganic luminescent particle 110 (e.g. QD or QR) has a type-I core 112/shell 1144 structure, the core 112 is a region in which luminescence substantially occurs, and a luminescence wavelength of the inorganic luminescent particle is determined as the sizes of the core 112. To achieve a quantum confinement effect, the core 112 necessarily has a smaller size than the exciton Bohr radius according to material of the inorganic luminescent particle 110, and an optical bandgap at a corresponding size.

The shell 114 of the inorganic luminescent particle 110 (e.g. QD or QR) promotes the quantum confinement effect of the core 112, and determines the stability of the particle 110. Atoms exposed on a surface of colloidal inorganic luminescent particle 110 (e.g. QD or QR) with only a single structure have lone pair electrons which do not participate in a chemical bond, unlike the internal atoms. Since energy levels of these surface atoms are between the conduction band edge and the valence band edge of the inorganic luminescent particle 110 (e.g. QD or QR), the charges may be trapped on the surface of the inorganic luminescence particle 110 (e.g. QD or QR), and thereby resulting in surface defects. Due to a non-radiative recombination process of excitons caused by the surface defects, the luminous efficiency of the inorganic luminescence particle 110 may be degraded, and the trapped charges may react with external oxygen and compounds, leading to a change in the chemical composition of the inorganic luminescence particle 110, or to a permanent loss of the electrical/optical properties of the inorganic luminescent particle 110.

To effectively form the shell 114 on the surface of the core 112, a lattice constant of the material in the shell 112 needs to be similar to that of the material in the core 114. As the surface of the core 112 is enclosed by the shell 114, the oxidation of the core 112 may be prevented, the chemical stability of the inorganic luminescence particle 110 (e.g. QD or QR) may be enhanced, and the photo-degradation of the core 112 by an external factor such as water or oxygen may be prevented. In addition, the loss of excitons caused by the surface trap on the surface of the core 112 may be minimized, and the energy loss caused by molecular vibration may be prevented, thereby enhancing the quantum efficiency.

In one exemplary aspect, each of the core 112 and the shell 114 may comprise, but is not limited to, semiconductor nanocrystals and/or metal oxide nanocrystals having quantum confinement effect. For example, the semiconductor nanocrystals of the core 112 may be selected from the group, but is not limited to, consisting of Group II-VI compound semiconductor nanocrystals, Group III-VI compound semiconductor nanocrystals, Group II-VI compound semiconductor nanocrystals, Group I-III-VI compound semiconductor nanocrystals and combination thereof.

Particularly, Group II-VI compound semiconductor nanocrystals of the core 112 may be selected from the group, but is not limited to, consisting of MgS, MgSe, MgTe, CaS, CaSe, CaTe, SrS, SrSe, SrTe, BaS, BaSe, BaTe, ZnS, ZnSe, ZnTe, ZnSeS, ZnTeSe, ZnO, CdS, CdSe, CdTe, CdSeS, CdZnS, CdSeTe, CdO, HgS, HgSe, HgTe, CdZnTe, HgCdTe, HgZnSe, HgZnTe, CdS/ZnS, CdS/ZnSe, CdSe/ZnS, CdSe/ZnSe, ZnSe/ZnS, ZnS/CdSZnS, CdS/CdZnS/ZnS, ZnS/ZnSe/CdSe and combination thereof.

Group III-V compound semiconductor nanocrystals of the core 112 may be selected from the group, but is not limited to, consisting of AlN, AlP, AlAs, AlSb, GaN, GaP, $Ga_2O_3$, GaAs, GaSb, InN, $In_2O_3$, InP, InAs, InSb, AlGaAs, InGaAs, InGaP, AlInAs, AlInSb, GaAsN, GaAsP, GaAsSb, AlGaN, AlGaP, InGaN, InAsSb, InGaSb, AlGaInP, AlGaAsP, InGaAsP, InGaAsSb, InAsSbP, AlInAsP, AlGaAsN, InGaAsN, InAlAsN, GaAsSbN, GaInNAsSb and combination thereof.

Group IV-VI compound semiconductor nanocrystals of the core 112 may be selected from the group, but is not limited to, consisting of $TiO_2$, $SnO_2$, SnS, $SnS_2$, SnTe, PbO, $PbO_2$, PbS, PbSe, PbTe, PbSnTe and combination thereof. Also, Group I-III-VI compound semiconductor nanocrystals of the core 112 may be selected from the group, but is not limited to, $AgGaS_2$, $AgGaSe_2$, $AgGaTe_2$, $AgInS_2$, $CuInS_2$, $CuInSe_2$, $CuzSnS_3$, $CuGaS_2$, $CuGaSe_2$ and combination thereof. Alternatively, the core 112 may include multiple layers each of which has different Groups compound semiconductor nanocrystals, e.g., Group III-V compound semiconductor nanocrystals and Group II-VI compound semiconductor nanocrystals such as InP/ZnS, InP/ZnSe, GaP/ZnS, and the likes.

In another aspect, the metal oxide nanocrystals of the core 112 may comprise, but is not limited to, Group II or Group III metal oxide nanocrystals. As an example, the metal oxide nanocrystals of the core 112 may be selected from the group, but is not limited to, MgO, CaO, SrO, BaO, $Al_2O_3$ and combination thereof.

The shell 114 may comprise, but is not limited to, semiconductor nanocrystals and/or metal oxide nanocrystals as the core 112. The shell 114 may comprise semiconductor nanocrystals or metal oxide nanocrystals having at least one metal component "M" on a surface thereof. The (iso) quinoline-based ligand 120 is coordinated to the metal component "M" so that a moiety "A" of the metal component "M" and the ligand 120 can emit lights different from the light emitted by the inorganic luminescent particle 110, as described below.

In one exemplary aspect, the shell 114 comprise the at least one metal component "M" which can form coordination bonds with the (iso) quinoline-based ligand 120 and emit blue or green (G) light. As an example, the at least one metal component "M" includes a first metal component "$M_1$" (see, FIG. 2) and/or a second metal component "$M_2$" (see, FIG. 3). In one aspect, the first metal component "$M_1$" (see, FIG. 2) forms coordination bonds with the (iso) quinoline-based ligand 120 to emit blue (B) light. The first metal component "$M_1$" may comprise, but is not limited to, at least one of zinc (Zn), magnesium (Mg) and cadmium (Cd). For example, the first metal component "$M_1$" forms coordination bonds with the (iso) quinoline-based ligand 120 to emit blue (B) light between about 460 and about 520 nm wavelength ranges.

In another aspect, the second metal component "$M_2$" (see, FIG. 3) forms coordination bonds with the (iso) quinoline-based ligand 120 to emit green (G) light. The second metal component "$M_2$" may comprise, but is not limited to, at least one of calcium (Ca) and aluminum (Al). For example, the second metal component "$M_2$" forms coordination bonds with the (iso) quinoline-based ligand 120 to emit green (G) light between about 500 to about 520 nm wavelength ranges. As an example, each of the first and second metal components "$M_1$" and "$M_2$" may be existed as a cationic type, e.g. divalent cation type or trivalent cation type, on the surface of the shell 114.

The shell 114A (see, FIG. 2) having a first metal component "$M_1$" (see, FIG. 2; e.g. Zn, Mg and/or Cd), which can form coordination bonds with the (iso) quinoline-based ligand 120 to emit blue (B) light, on the surface thereof may comprise, but is not limited to, 1) Group II-VI compound semiconductor nanocrystals selected from the group consisting of MgS, MgSe, MgTe, ZnS, ZnSe, ZnTe, ZnSeS, ZnTeSe, ZnO, CdS, CdSe, CdTe, CdSeS, CdZnS, CdSeTe, CdO, CdZnTe, HgCdTe, HgZnSe, HgZnTe, CdS/ZnS, CdS/ZnSe, CdSe/ZnS, CdSe/ZnSe, ZnSe/ZnS, ZnS/CdSZnS, CdS/CdZnS/ZnS, ZnS/ZnSe/CdSe and combination thereof; 2) multiple-layered semiconductor nanocrystals, e.g. Group III-V compound semiconductor nanocrystals-Group II-VI compound semiconductor nanocrystals such as InP/ZnS, InP/ZnSe, GaP/ZnS, and the likes; and/or 3) metal oxide nanocrystals such as MgO.

Alternatively, the shell 114B (see, FIG. 3) having a second metal component "$M_2$" (see, FIG. 3; e.g. Ca and/or Al), which can form coordination bonds with the (iso) quinoline-based ligand 120 to emit green (G) light, on the surface thereof may comprise, but is not limited to, 1) Group II-VI compound semiconductor nanocrystals selected from the group consisting of CaS, CaSe, CaTe and combination thereof; 2) Group III-V compound semiconductor nanocrystals selected from the group consisting of AlN, AlP, AlAs, AlSb, AlGaAs, AlInAs, AlInSb, AlGaN, AlGaP, AlGaInP, AlGaAsP, AlInAsP, AlGaAsN, InAlAsN and combination thereof; and/or 3) metal oxide nanocrystals such as CaO, $Al_2O_3$ and combination thereof.

The semiconductor nanocrystals of the core 112 and/or the shell 114 may be doped with a rare earth element such as Eu, Er, Tb, Tm, Dy or an arbitrary combination thereof or may be doped with a transition metal element such as Mn, Cu, Ag, Al or an arbitrary combination thereof.

The inorganic luminescent particle 110 including the core 112 and the shell 114 may have a mean particle size between about 1 nm and about 30 nm. As an example, the inorganic luminescent particle 110 emitting red or green (G) light (about 500 to about 800 nm of wavelength ranges) may have a mean particle size between about 5 and about 30 nm, while the inorganic luminescent particle 110 emitting blue (B) light (about 400 to about 500 nm of wavelength ranges) may have a mean particle size between about 1 and about 10 nm. However, the present disclosure is not limited thereto.

In an exemplary aspect, the inorganic luminescent particle 110 may comprise alloy QD or alloy QR such as homogenous alloy QD or QR or gradient alloy QD or QR, e.g. $CdS_xSe_{1-x}$, $CdSe_xTe_{1-x}$, $Cd_xZn_{1-x}S$, $Zn_xCd_{1-x}Se$, $CuIn_{1-x}S$, $CuIn_{1-x}Se$, $AgIn_{1-x}S$.

The ligand 120 may comprise an (iso) quinoline-based ligand that is coordinated to the at least one metal components "M" on the surface of the shell 114 forming the outer perimeter of the inorganic luminescent particle 110 to emit lights of particular wavelength ranges. As an example, the ligand 120 may be derived from an (iso) quinoline-based compound having the following Chemical Formula 1:

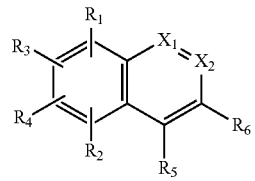

Chemical Formula 1 wherein $R_1$ is selected from the group consisting of hydroxyl group, amino group, $C_1$-$C_{10}$ alkyl amino group and $C_1$-$C_{10}$ alkyl amido group; $R_2$ is selected from the group consisting of protium, deuterium, tritium, $C_1$-$C_{10}$ alkyl group, halogen, nitro group, amino group, $C_1$-$C_{10}$ alkyl amino group, $C_1$-$C_{10}$ alkyl amido group and sulfonyl group; each of $R_3$ to $R_6$ is independently selected from the group consisting of protium, deuterium, tritium and $C_1$-$C_{10}$ alkyl group; one of $X_1$ and $X_2$ is nitrogen (N) and the other of $X_1$ and $X_2$ is $CR_7$, wherein $R_7$ is selected from the group consisting of protium, deuterium, tritium, $C_1$-$C_{10}$ alkyl group, halogen, nitro group, amino group, $C_1$-$C_{10}$ alkyl amino group and $C_1$-$C_{10}$ alkyl amido group.

As an example, $R_1$ may be selected from the group consisting of hydroxyl group, amino group, $C_1$-$C_5$ alkyl amino group and $C_1$-$C_5$ alkyl amido group. $R_2$ may be selected from the group consisting of protium, deuterium, tritium, halogen, nitro group, amino group, $C_1$-$C_{10}$ alkyl amino group, $C_1$-$C_{10}$ alkyl amido group and sulfonyl group. Each of $R_3$ to $R_6$ may be selected from the group consisting of protium, deuterium, tritium and $C_1$-$C_5$ alkyl group, and $R_7$ may be selected from the group consisting of protium, deuterium, tritium and $C_1$-$C_{10}$ alkyl group.

In one exemplary aspect, the (iso) quinoline-based ligand represented by Chemical Formula 1 may have at least one substituents that can be coordinated to the at least one metal component "M" on the surface of the shell 114. As an example, the (iso) quinoline-based compound may comprise an (iso) quinoline-based compound having the following structure of Chemical Formula 2:

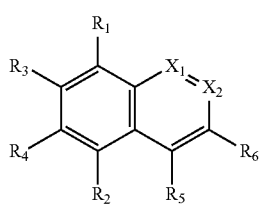

Chemical Formula 2 wherein each of $R_1$ to $R_6$, $X_1$ and $X_2$ is identical as defined in Chemical Formula 1.

As an example, the (iso) quinoline-based compound having the structure of Chemical Formula 1 or Chemical Formula 2 may be selected from the group, but is not limited to, consisting of 8-hydroxy(iso)quinoline), 5-nitro-8-hydroxy(iso)quinoline, 5-chloro-8-hydroxy(iso)quinoline), 5-amino-8-hydroxy(iso)quinoline, 8-amino(iso)quinoline), 8-(iso)quinoline sulfonic acid), 8-acetamido(iso)quinoline) and combination thereof.

In order to fabricate the illuminant 100, the inorganic luminescent particle 100 (e.g. QD or QR) is dissolved in an organic solvent to disperse the particle 100 in the solvent, the (iso) quinoline-based compound having the structure of Chemical Formulae 1 and 2 is added into the solution, and the mixture was stirred for about 20 minutes to about 2 hours or left for about 3 hours to about 24 hours to remove the solvent as impurity and purify the illuminant 100 as a final product. The solvent dispersing the inorganic luminescent particle 100 may comprises, but is not limited to, an organic solvent such as $C_5$-$C_{20}$ alkane-based solvent, or $C_6$-$C_{10}$ alkane-based solvent (e.g. hexane, octane and the likes); chloroform, acetone, and the likes. Also, another organic solvent such as toluene, methanol, ethanol and combination thereof may be used to separate the dispersing solvent and purify the product.

Figure 2:
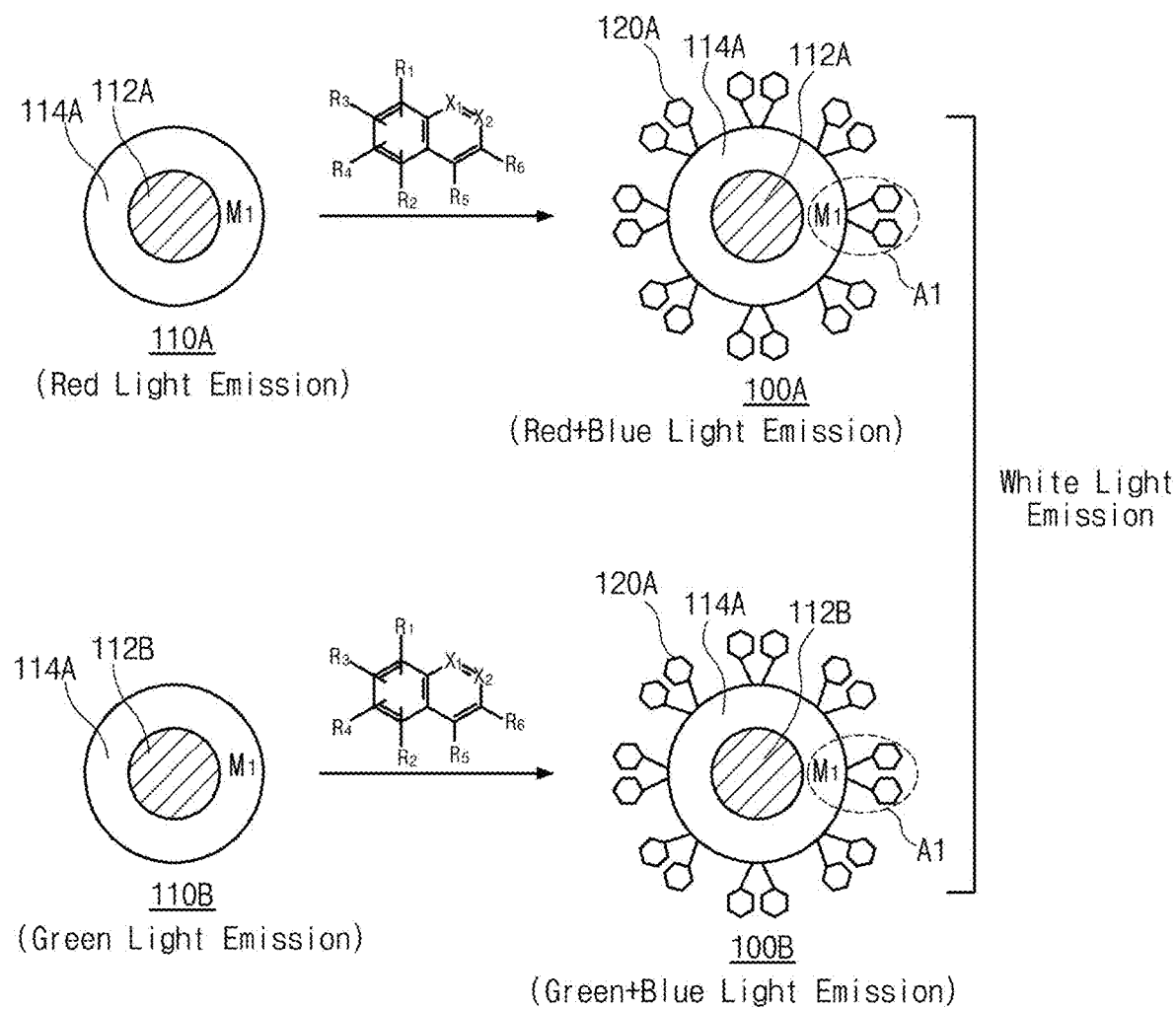
FIGS. 2 and 3 are schematic diagrams illustrating a state of implementing white luminescence using an illuminant including an inorganic luminescent particle having a metal component on a surface thereof, and an (iso) quinoline-base ligand coordinated to the metal component in accordance with an exemplary aspect of the present disclosure.
Figure 3:
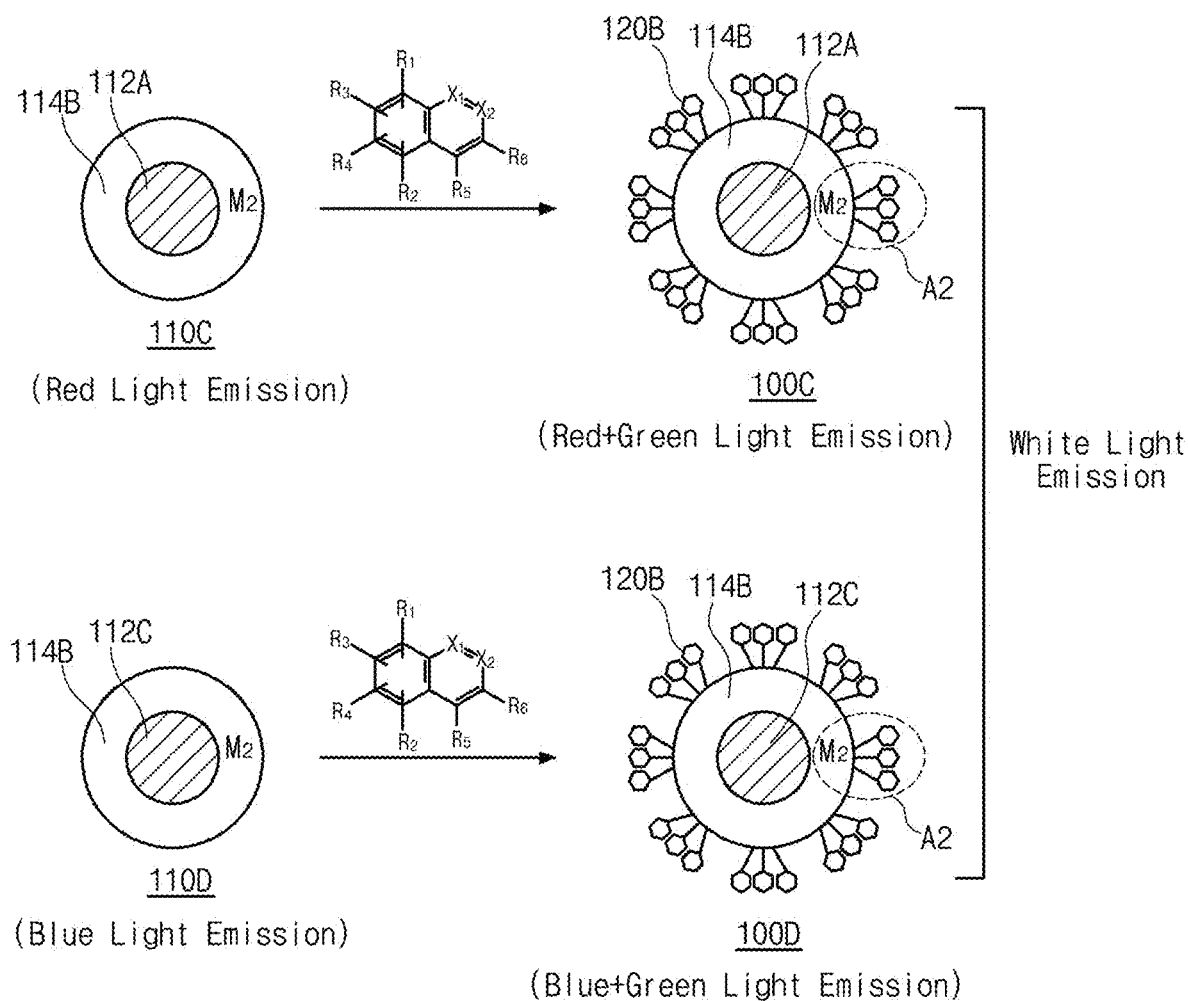

It is possible to implement white (W) light emission (white luminescence) using the inorganic illuminant with ease. FIGS. 2 and 3 are schematic diagrams illustrating a state of implementing white luminescence using an illuminant including an inorganic luminescent particle having a metal component on a surface thereof, and an (iso) quinoline-base ligand coordinated to the metal component in accordance with an exemplary aspect of the present disclosure. FIG. 2 illustrates a state of implementing white luminescence as a moiety of the metal component and an (iso) quinoline-based ligand coordinated to the metal component emits blue (B) light.

As illustrated in FIG. 2, the illuminant 100A or 100B comprise an inorganic luminescent particle 110A or 110B and an (iso) quinoline-based ligand 120A coordinated to the inorganic luminescent particle 110A or 110B. The inorganic luminescent particle 110A or 110B comprise a core 112A or 112B and a shell 114A having a first metal component "$M_1$" on the surface thereof. Each of the inorganic luminescent particles 110A and 110B may have a type I, a type II or a reverse type I "core 112A or 112B/shell 114A" structure, as described above. Alternatively, the inorganic luminescent particle 110A or 110B may be an alloy QD or an alloy QR. We will explain the illuminant 100A or 100B focusing on the type I QD or QR where the core 110A or 110B is illuminated as the inorganic luminescent particle 110A or 110B, referring to FIG. 2. Each of the core 112A or 112B and the shell 114A may comprise semiconductor nanocrystals and/or metal oxide nanoparticles, as described above.

As illustrated in the top of FIG. 2, the red (R) light emitting inorganic luminescent particle 110A comprise the core 112A emitting red (R) light, and the shell 114A enclosing the core 112A and having the first metal component "$M_1$" on the surface thereof. As an example, the first metal component "$M_1$" comprise, but is not limited to, at least one of zinc (Zn), magnesium (Mg) and cadmium (Cd). The first metal component "$M_1$" on the surface of the shell 114A reacts with the (iso) quinoline-based compound 120A having the structure of Chemical Formulae 1 and 2 so that the illuminant 100A forming coordination bonds between the first metal component "$M_1$" on the surface of the shell 114A and the (iso) quinoline-based ligand 120A can be fabricated or synthesized. In this case, a moiety "A1" having the first metal component "$M_1$" and the (iso) quinoline-base ligand 120A coordinated to the first metal component "$M_1$" emits blue (B) light between about 460 nm to about 520 nm of wavelength ranges. The inorganic illuminant 100A emits two kinds of lights having different luminescent wavelength ranges, i.e., red (R) light at the core 112A and blue (B) light at the moiety "A1" forming coordination bonds between the first metal component "$M_1$" and the (iso) quinoline-based ligand 120A.

Alternatively, as illustrated in the bottom of FIG. 2, the green (G) light emitting inorganic luminescent particle 110B comprise the core 112B emitting green (G) light, and the shell 114A enclosing the core 112B and having the first metal component "$M_1$" on the surface thereof. The first metal component "$M_1$" on the surface of the shell 114A reacts with the (iso) quinoline-based compound 120A having the structure of Chemical Formulae 1 and 2 so that the illuminant 100B forming coordination bonds between the first metal component "$M_1$" on the surface of the shell 114A and the (iso) quinoline-based ligand 120A can be fabricated. In this case, a moiety "A1" having the first metal component "$M_1$" and the (iso) quinoline-base ligand 120A coordinated to the first metal component "$M_1$" emits blue (B) light between about 460 nm to about 520 nm of wavelength ranges. The inorganic illuminant 100B emits two kinds of lights having different luminescent wavelength ranges, i.e., green (G) light at the core 112B and blue (B) light at the moiety "A1" forming coordination bonds between the first metal component "$M_1$" and the (iso) quinoline-based ligand 120A. It is possible to implement white (W) light emission by mixing the inorganic illuminant 100A that emits red and blue (B) lights with the inorganic illuminant 100B that emits green and blue (B) lights.

FIG. 3 illustrates a state of implementing white luminescence as a moiety of the metal component and (iso) quinoline-based ligand coordinated to the metal component emits green (G) light. As illustrated in FIG. 3, the illuminant 100C or 100D comprise an inorganic luminescent particle 110C or 110D and an (iso) quinoline-based ligand 120B coordinated to the inorganic luminescent particle 110C or 110D. The inorganic luminescent particle 110C or 110D comprise a core 112A or 112C and a shell 114B having a second metal component "$M_2$" on the surface thereof. Each of the inorganic luminescent particles 110C and 110D may have a type I, a type II or a reverse type I "core 112A or 112C/shell 114B" structure, as described above. Alternatively, the inorganic luminescent particle 110C or 110D may be an alloy QD or an alloy QR. We will explain the illuminant 100C or 110D focusing on the type I QD or QR where the core 110C or 110D is illuminated as the inorganic luminescent particle 110C or 110D, referring to FIG. 3. Each of the core 112A or 112C and the shell 114B may comprise semiconductor nanocrystals and/or metal oxide nanoparticles, as described above.

As illustrated in the top of FIG. 3, the red (R) light emitting inorganic luminescent particle 110C comprise the core 112A emitting red (R) light, and the shell 114B enclosing the core 112A and having the second metal component "$M_2$" on the surface thereof. As an example, the second metal component "$M_2$" comprise, but is not limited to, at least one of calcium (Ca) and aluminum (Al). The second metal component "$M_2$" on the surface of the shell 114B reacts with the (iso) quinoline-based compound 120B having the structure of Chemical Formulae 1 and 2 so that the illuminant 100C forming coordination bonds between the second metal component "$M_2$" on the surface of the shell 114B and the (iso) quinoline-based ligand 120B can be fabricated. In this case, a moiety "A2" having the second metal component "$M_2$" and the (iso) quinoline-base ligand 120B coordinated to the second metal component "$M_2$" emits green (G) light between about 500 nm to about 550 nm of wavelength ranges. The inorganic illuminant 100C emits two kinds of lights having different luminescent wavelength ranges, i.e., red (R) light at the core 112A and green (G) light at the moiety "A2" forming coordination bonds between the second metal component "$M_2$" and the (iso) quinoline-based ligand 120B.

Alternatively, as illustrated in the bottom of FIG. 3, the blue (B) light emitting inorganic luminescent particle 110D comprise the core 112C emitting blue (B) light, and the shell 114B enclosing the core 112C and having the second metal component "$M_2$" on the surface thereof. The second metal component "$M_2$" on the surface of the shell 114B reacts with the (iso) quinoline-based compound 120B having the structure of Chemical Formulae 1 and 2 so that the illuminant 100D forming coordination bonds between the second metal component "$M_2$" on the surface of the shell 114B and the (iso) quinoline-based ligand 120B can be fabricated. In this case, the moiety "A2" having the second metal component "$M_2$" and the (iso) quinoline-base ligand 120B coordinated to the second metal component "$M_2$" emits green (G) light between about 500 nm to about 550 nm of wavelength ranges. The inorganic illuminant 100D emits two kinds of lights having different luminescent wavelength ranges, i.e., blue light at the core 112C and green (G) light at the moiety "A2" forming coordination bonds between the second metal component "$M_2$" and the (iso) quinoline-based ligand 120B. It is possible to implement white (W) light emission by mixing the inorganic illuminant 100C that emits red and green (G) lights, with the inorganic illuminant 100D that emits blue and green (G) lights.

Figure 4:
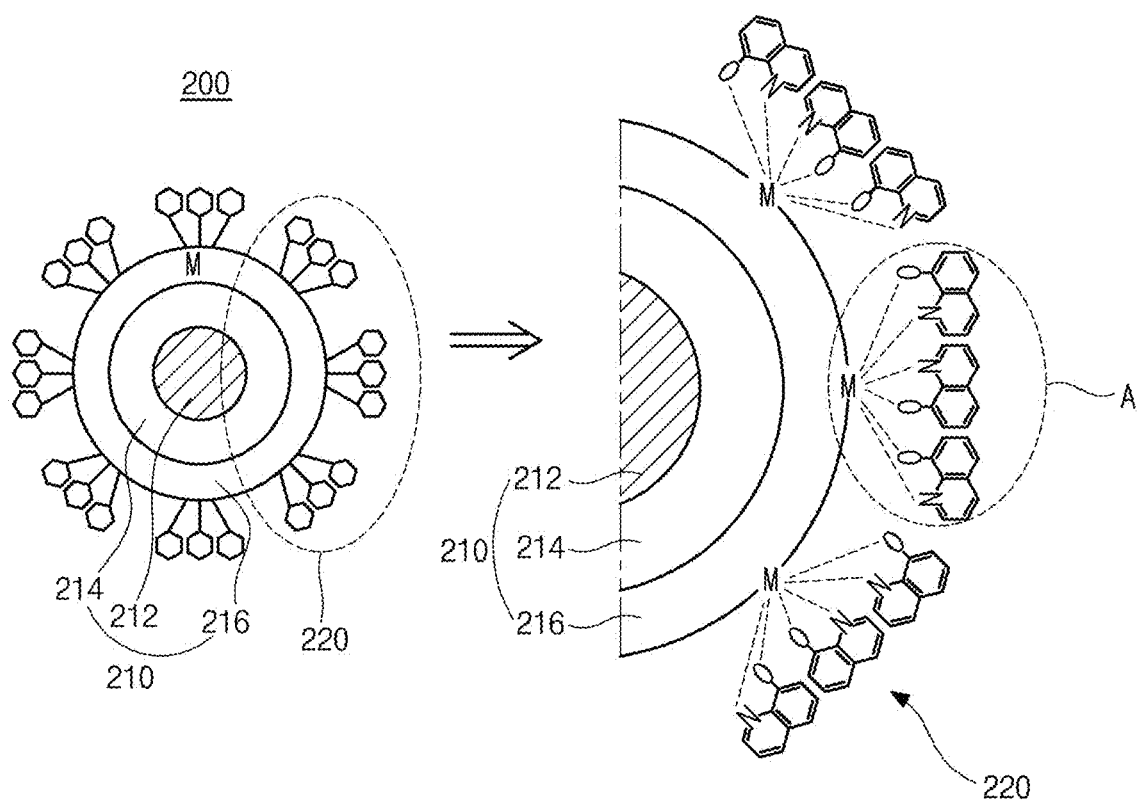
FIG. 4 is a schematic diagram illustrating an illuminant comprising an inorganic luminescent particle including a core, a shell and a coating and having a metal component on a surface thereof, and an (iso) quinoline-based ligand coordinated to the metal component in accordance with an exemplary aspect of the present disclosure. 8-hydroxyquinole (HQ) as an (iso) quinoline-based ligand is illustrated.

FIG. 4 is a schematic diagram illustrating an illuminant comprising an inorganic luminescent particle including a core, a shell and a coating and having a metal component on a surface thereof, and an (iso) quinoline-based ligand coordinated to the metal component in accordance with an exemplary aspect of the present disclosure. As illustrated in FIG. 4, an inorganic illuminant 200 comprises an inorganic luminescent particle 210 having at least one metal component "M" on a surface thereof, and an (iso) quinoline-based ligand 220 coordinated to the at least one metal component "M".

The inorganic luminescent particle 210 may comprise an inorganic luminescent nano particle such as QD or QR. As an example, the inorganic luminescent particle 210 may comprise a core 212, a shell 214 enclosing the core 212, and a coating 216 enclosing the shell 214. Each of the core 212 and the shell 214 may have a single layered core and a single layered shell, respectively. Alternatively, each of the core 212 and the shell 214 may have multiple layered cores and multiple layered shells, respectively. The inorganic luminescent particle 210 may have type I core/shell structure, type II core/shell structure or reverse type I core/shell structure.

Each of the core 212 and shell 214 may comprise semiconductor nanocrystals and/or metal oxide nanocrystals having quantum confinement effect. For example, the semiconductor nanocrystals in each of the core 212 and the shell may be selected from the group, but is not limited to, consisting of Group II-VI compound semiconductor nanocrystals, Group III-V compound semiconductor nanocrystals, Group IV-VI compound semiconductor nanocrystals, Group I-III-VI compound semiconductor nanocrystals and combination thereof.

Particularly, Group II-VI compound semiconductor nanocrystals of the core 212 and/or the shell 214 may be selected from the group, but is not limited to, consisting of MgS, MgSe, MgTe, CaS, CaSe, CaTe, SrS, SrSe, SrTe, BaS, BaSe, BaTe, ZnS, ZnSe, ZnTe, ZnSeS, ZnTeSe, ZnO, CdS, CdSe, CdTe, CdSeS, CdZnS, CdSeTe, CdO, HgS, HgSe, HgTe, CdZnTe, HgCdTe, HgZnSe, HgZnTe, CdS/ZnS, CdS/ZnSe, CdSe/ZnS, CdSe/ZnSe, ZnSe/ZnS, ZnS/CdSZnS, CdS/CdZnS/ZnS, ZnS/ZnSe/CdSe and combination thereof.

Group III-V compound semiconductor nanocrystals of the core 212 and/or the shell 214 may be selected from the group, but is not limited to, consisting of AlN, AlP, AlAs, AlSb, GaN, GaP, $Ga_2O_3$, GaAs, GaSb, InN, $In_2O_3$, InP, InAs, InSb, AlGaAs, InGaAs, InGaP, AlInAs, AlInSb, GaAsN, GaAsP, GaAsSb, AlGaN, AlGaP, InGaN, InAsSb, InGaSb, AlGaInP, AlGaAsP, InGaAsP, InGaAsSb, InAsSbP, AlInAsP, AlGaAsN, InGaAsN, InAlAsN, GaAsSbN, GaInNAsSb and combination thereof.

Group IV-VI compound semiconductor nanocrystals of the core 212 and/or the shell may be selected from the group, but is not limited to, consisting of $TiO_2$, $SnO_2$, SnS, $SnS_2$, SnTe, PbO, $PbO_2$, PbS, PbSe, PbTe, PbSnTe and combination thereof. Also, Group I-III-VI compound semiconductor nanocrystals of the core 212 and/or the shell 214 may be selected from the group, but is not limited to, $AgGaS_2$, $AgGaSe_2$, $AgGaTe_2$, $AgInS_2$, $CuInS_2$, $CuInSe_2$, $Cu_2SnS_3$, $CuGaS_2$, $CuGaSe_2$ and combination thereof. Alternatively, the core 212 and/or the shell 214 may include multiple layers each of which has different Groups compound semiconductor nanocrystals, e.g., Group II-VI compound semiconductor nanocrystals and Group III-V compound semiconductor nanocrystals such as InP/ZnS, InP/ZnSe, GaP/ZnS, and the likes.

In another aspect, the metal oxide nanocrystals of the core 212 and/or the shell 214 may comprise, but is not limited to, Group II or Group m metal oxide nanocrystals. As an example, the metal oxide nanocrystals of the core 212 and/or the shell 214 may be selected from the group, but is not limited to, MgO, CaO, SrO, BaO, $Al_2O_3$ and combination thereof. The semiconductor nanocrystals of the core 212 and/or the shell 214 may be doped with a rare earth element such as Eu, Er, Tb, Tm, Dy or an arbitrary combination thereof or may be doped with a transition metal element such as Mn, Cu, Ag, Al or an arbitrary combination thereof.

In an exemplary aspect, the inorganic luminescent particle 210 may comprise alloy QD or alloy QR such as homogenous alloy QD or QR or gradient alloy QD or QR, e.g. $CdS_xSe_{1-x}$, $CdSe_xTe_{1-x}$, $Cd_xZn_{1-x}S$, $Zn_xCd_{1-x}Se$, $CuIn_{1-x}S$, $CuIn_{1-x}Se$, $AgIn_{1-x}S$.

The inorganic luminescent particle 210 comprises the coating 216 enclosing the shell 214. The coating 216 has the at least one metal component "M" on a surface thereof. The (iso) quinoline-based ligand 220 is coordinated to the metal component "MO so that a moiety "A" of the metal component "M" and the ligand 220 can emit lights different from the light emitted by the inorganic luminescent particle 210, as described below.

In one exemplary aspect, the coating 216 may comprise at least one metal component "M" which can form coordination bonds with the (iso) quinoline-based ligand 220 and emit blue or green (G) light. As an example, the at least one metal component "M" includes a first metal component "$M_1$" (see, FIG. 5) and/or a second metal component "$M_2$" (see, FIG. 6). In one aspect, the first metal component "$M_1$" (see, FIG. 5) forms coordination bonds with the (iso) quinoline-based ligand 220 to emit blue (B) light. The first metal component "$M_1$" may comprise, but is not limited to, at least one of zinc (Zn), magnesium (Mg) and cadmium (Cd). For example, the first metal component "$M_1$" forms coordination bonds with the (iso) quinoline-based ligand 220 to emit blue (B) light between about 460 and about 520 nm wavelength ranges.

In another aspect, the second metal component "$M_2$" (see, FIG. 6) forms coordination bonds with the (iso) quinoline-based ligand 220 to emit green (G) light. The second metal component "$M_2$" may comprise, but is not limited to, at least one of calcium (Ca) and aluminum (Al). For example, the second metal component "$M_2$" forms coordination bonds with the (iso) quinoline-based ligand 220 to emit green (G) light between about 500 to about 520 nm wavelength ranges. As an example, each of the first and second metal components "$M_1$" and "$M_2$" may be existed as a cationic type, e.g. divalent cation type or trivalent cation type, on the surface of the shell 114.

In one exemplary aspect, the coating 216 may comprise an oxide nano particle, a nitride nano particle or a halogenide nano particle each of which has the at least one metal component "M" on the surface thereof. The at least one metal component "M" may comprise, but is not limited to, at least one of zinc (Zn), magnesium (Mg), cadmium (Cd), calcium (Ca) and aluminum (Al). as an example, the coating 216 may have mono-layered or multiple-layered structure and comprise, but is not limited to, ZnO, MgO, CdO, CaO, $Al_2O_3$, AlN, AlGaN, AlGaAsN, InAlAsN, $MgF_2$ and combination thereof.

The (iso) quinoline-based ligand 120 may have the structure of Chemical Formulae 1 and 2, and form coordination bonds with the at least one meal component "M" on the surface of the coating 216 to emit light of particular wavelength ranges. As an example, the (iso) quinoline-based ligand may be selected from the group, but is not limited to, consisting of 8-hydroxy(iso)quinoline), 5-nitro-8-hydroxy(iso)quinoline, 5-chloro-8-hydroxy(iso)quinoline), 5-amino-8-hydroxy(iso)quinoline, 8-amino(iso)quinoline), 8-(iso)quinoline sulfonic acid), 8-acetamido(iso)quinoline) and combination thereof.

Figure 5:
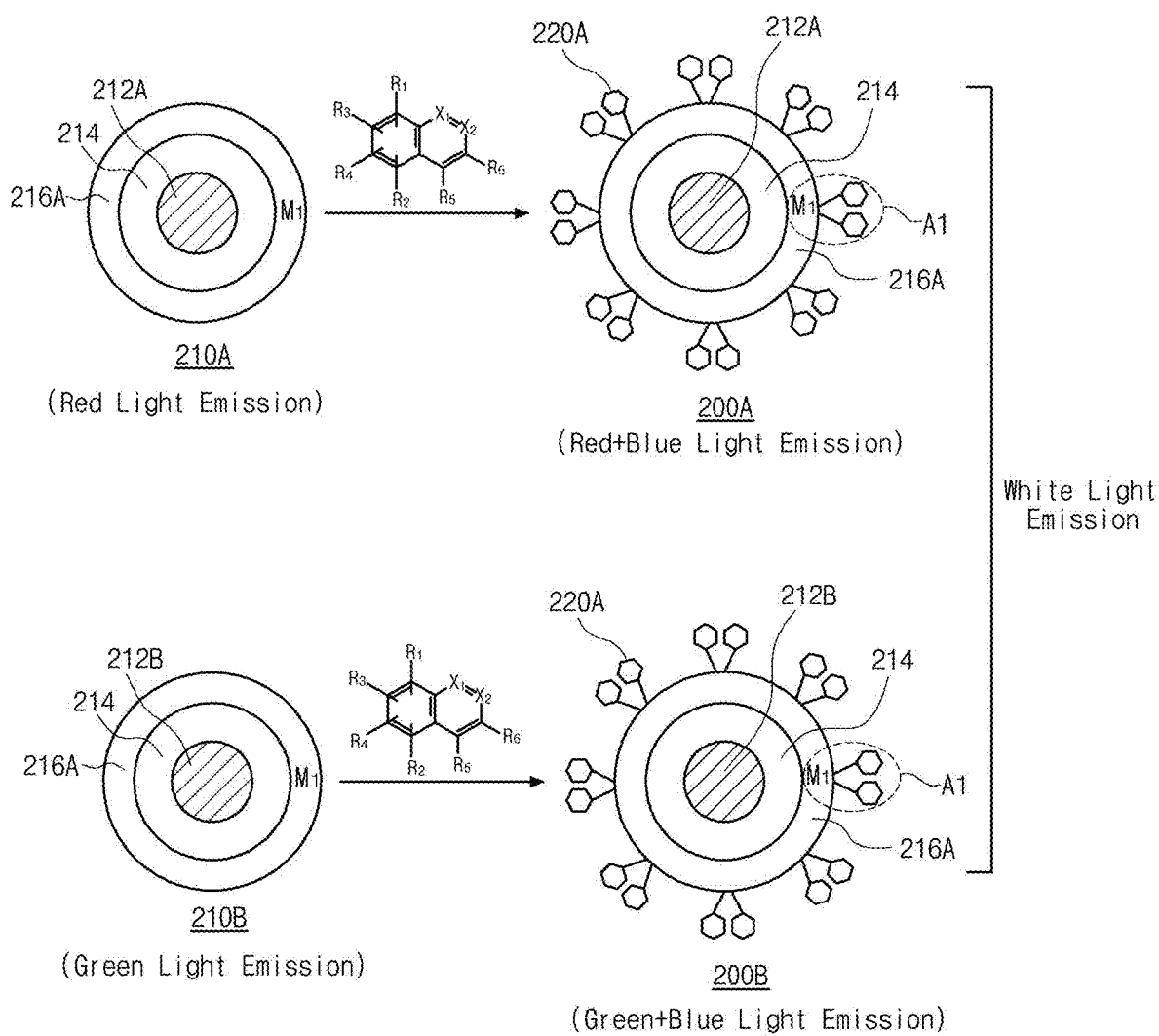
FIGS. 5 and 6 are schematic diagrams illustrating a state of implementing white luminescence using an illuminant including an inorganic luminescent particle having a metal component on a surface thereof, and an (iso) quinoline-base ligand coordinated to the metal component in accordance with an exemplary aspect of the present disclosure.
Figure 6:
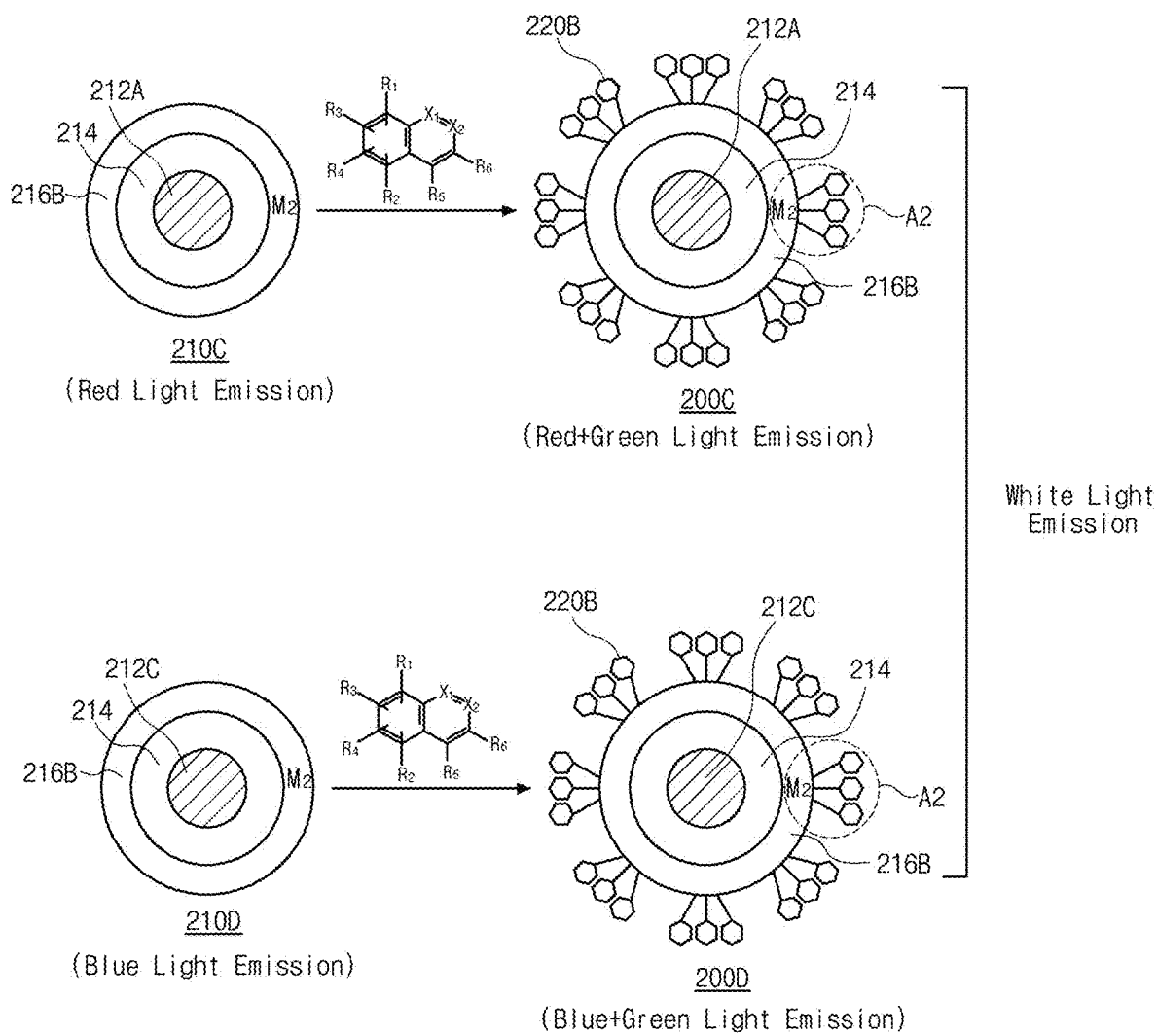

It is possible to implement white (W) light emission (white luminescence) using the inorganic illuminant with ease. FIGS. 5 and 6 are schematic diagrams illustrating a state of implementing white luminescence using an illuminant including an inorganic luminescent particle having a metal component on a surface thereof, and an (iso) quinoline-base ligand coordinated to the metal component in accordance with an exemplary aspect of the present disclosure. FIG. 5 illustrates a state of implementing white luminescence as a moiety of the metal component and an (iso) quinoline-based ligand coordinated to the metal component emits blue (B) light.

As illustrated in FIG. 5, the illuminant 200A or 200B comprise an inorganic luminescent particle 210A or 210B and an (iso) quinoline-based ligand 220A coordinated to the inorganic luminescent particle 210A or 210B. The inorganic luminescent particle 210A or 210B comprise a core 212A or 212B, a shell 214 enclosing the core 210A or 210B and a coating 216A enclosing the shell 214 and having a first metal component "$M_1$" on the surface thereof. Each of the inorganic luminescent particles 210A and 210B may have a type I, a type II or a reverse type I "core 212A or 212B/shell 214" structure, as described above. Alternatively, the inorganic luminescent particle 210A or 210B may be an alloy QD or an alloy QR. We will explain the illuminant 200A or 200B focusing on the type I QD or QR where the core 210A or 210B is illuminated as the inorganic luminescent particle 210A or 210B, referring to FIG. 5. Each of the core 212A or 212B and the shell 214 may comprise semiconductor nanocrystals and/or metal oxide nanoparticles, as described above.

As illustrated in the top of FIG. 5, the red (R) light emitting inorganic luminescent particle 210A comprise the core 212A emitting red (R) light, the shell 214 enclosing the core 212A and the coating 216A having a first metal component "M1" on the surface thereof. As an example, the first metal component "$M_1$" comprise, but is not limited to, at least one of zinc (Zn), magnesium (Mg) and cadmium (Cd). The first metal component "$M_1$" on the surface of the coating 216A reacts with the (iso) quinoline-based compound 220A having the structure of Chemical Formulae 1 and 2 so that the illuminant 200A forming coordination bonds between the first metal component "$M_1$" on the surface of the coating 216A and the (iso) quinoline-based ligand 220A can be fabricated or synthesized. In this case, a moiety "A1" having the first metal component "$M_1$" and the (iso) quinoline-base ligand 220A coordinated to the first metal component "$M_1$" emits blue (B) light between about 460 nm to about 520 nm of wavelength ranges. The inorganic illuminant 200A emits two kinds of lights having different luminescent wavelength ranges, i.e., red (R) light at the core 212A and blue (B) light at the moiety "A1" forming coordination bonds between the first metal component "$M_1$" and the (iso) quinoline-based ligand 220A.

Alternatively, as illustrated in the bottom of FIG. 5, the green (G) light emitting inorganic luminescent particle 210B comprise the core 112B emitting green (G) light, and the shell 214 enclosing the core 212B and the coating 216A enclosing the shell 214 and having the first metal component "$M_1$" on the surface thereof. The first metal component "$M_1$" on the surface of the coating 216A reacts with the (iso) quinoline-based compound 220A having the structure of Chemical Formulae 1 and 2 so that the illuminant 200B forming coordination bonds between the first metal component "$M_1$" on the surface of the coating 216A and the (iso) quinoline-based ligand 220A can be fabricated. In this case, a moiety "A1" having the first metal component "$M_1$" and the (iso) quinoline-base ligand 220A coordinated to the first metal component "$M_1$" emits blue (B) light between about 460 nm to about 520 nm of wavelength ranges. The inorganic illuminant 200B emits two kinds of lights having different luminescent wavelength ranges, i.e., green (G) light at the core 212B and blue (B) light at the moiety "A1" forming coordination bonds between the first metal component "$M_1$" and the (iso) quinoline-based ligand 220A. It is possible to implement white (W) light emission by mixing the inorganic illuminant 200A that emits red and blue (B) lights with the inorganic illuminant 200B that emits green and blue (B) lights.

FIG. 6 illustrates a state of implementing white luminescence as a moiety of the metal component and (iso) quinoline-based ligand coordinated to the metal component emits green (G) light. As illustrated in FIG. 6, the illuminant 200C or 200D comprise an inorganic luminescent particle 210C or 210D and an (iso) quinoline-based ligand 220B coordinated to the inorganic luminescent particle 210C or 210D. The inorganic luminescent particle 210C or 210D comprise a core 212A or 212C, a shell 214 enclosing the core 212A or 212B and a coating 216B enclosing the shell 214 and having a second metal component "$M_2$" on the surface thereof. Each of the inorganic luminescent particles 210C and 210D may have a type I, a type II or a reverse type I "core 212A or 212C/shell 214" structure, as described above. Alternatively, the inorganic luminescent particle 210C or 210D may be an alloy QD or an alloy QR. We will explain the illuminant 200C or 210D focusing on the type I QD or QR where the core 210C or 210D is illuminated as the inorganic luminescent particle 210C or 210D, referring to FIG. 6. Each of the core 212A or 212C and the shell 214 may comprise semiconductor nanocrystals and/or metal oxide nanoparticles, as described above.

As illustrated in the top of FIG. 6, the red (R) light emitting inorganic luminescent particle 210C comprise the core 212A emitting red (R) light, the shell 214 enclosing the core 212A and the coating 216B enclosing the shell 214 and having the second metal component "$M_2$" on the surface thereof. As an example, the second metal component "$M_2$" comprise, but is not limited to, at least one of calcium (Ca) and aluminum (Al). The second metal component "$M_2$" on the surface of the coating 216B reacts with the (iso) quinoline-based compound 220B having the structure of Chemical Formulae 1 and 2 so that the illuminant 200C forming coordination bonds between the second metal component "$M_2$" on the surface of the coating 216B and the (iso) quinoline-based ligand 220B can be fabricated. In this case, a moiety "A2" having the second metal component "$M_2$" and the (iso) quinoline-base ligand 220B coordinated to the second metal component "$M_2$" emits green (G) light between about 500 nm to about 550 nm of wavelength ranges. The inorganic illuminant 200C emits two kinds of lights having different luminescent wavelength ranges, i.e., red (R) light at the core 212A and green (G) light at the moiety "A2" forming coordination bonds between the second metal component "$M_2$" and the (iso) quinoline-based ligand 120B.

Alternatively, as illustrated in the bottom of FIG. 6, the blue (B) light emitting inorganic luminescent particle 210D comprise the core 212C emitting blue (B) light, and the shell 214 enclosing the core 112C and the coating 216B enclosing the shell 214 and having the second metal component "$M_2$" on the surface thereof. The second metal component "$M_2$" on the surface of the coating 216B reacts with the (iso) quinoline-based compound 220B having the structure of Chemical Formulae 1 and 2 so that the illuminant 200D forming coordination bonds between the second metal component "$M_2$" on the surface of the coating 216B and the (iso) quinoline-based ligand 220B can be fabricated. In this case, the moiety "A2" having the second metal component "$M_2$" and the (iso) quinoline-base ligand 220B coordinated to the second metal component "$M_2$" emits green (G) light between about 500 nm to about 550 nm of wavelength ranges. The inorganic illuminant 200D emits two kinds of lights having different luminescent wavelength ranges, i.e., blue light at the core 212C and green (G) light at the moiety "A2" forming coordination bonds between the second metal component "$M_2$" and the (iso) quinoline-based ligand 220B.

It is possible to implement white (W) light emission by mixing the inorganic illuminant 200C that emits red and green (G) lights with the inorganic illuminant 200D that emits blue and green (G) lights.

Figure 7:
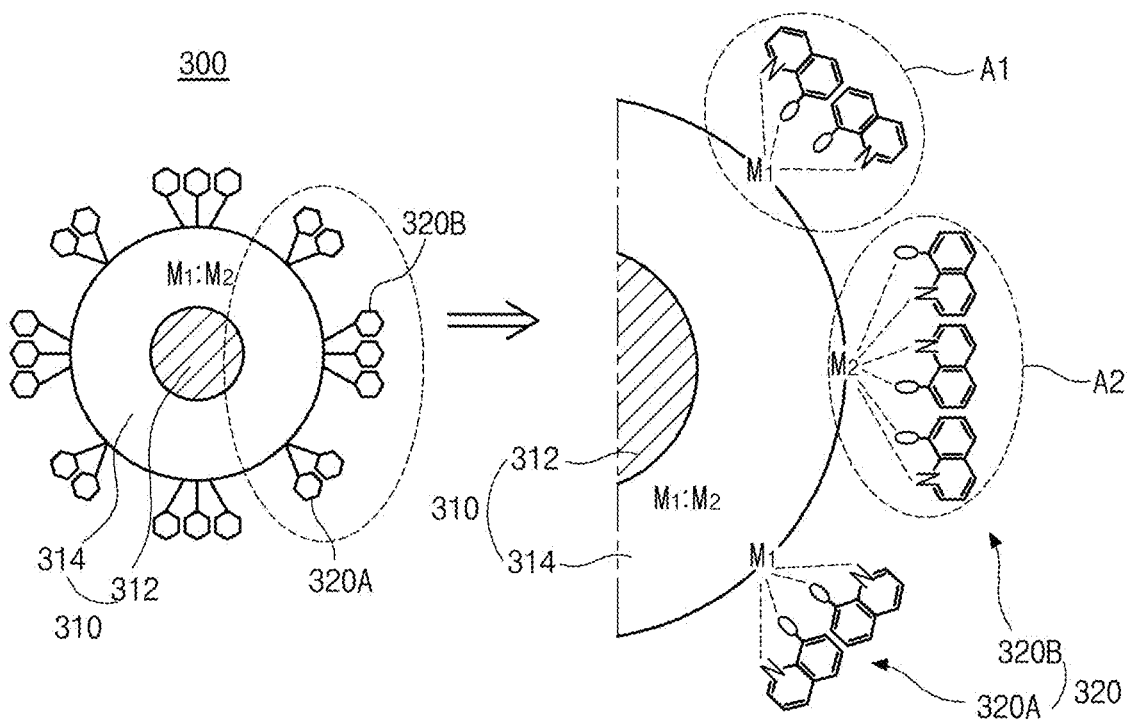
FIG. 7 is a schematic diagram illustrating an illuminant comprising an inorganic luminescent particle including a core and a shell and having doped metal components on a surface thereof, and an (iso) quinoline-based ligand coordinated to the metal component in accordance with an exemplary aspect of the present disclosure. 8-hydroxyquinole (HQ) as an (iso) quinoline-based ligand is illustrated.

Now, we will explain another inorganic illuminant in accordance with a third aspect of the present disclosure. FIG. 7 is a schematic diagram illustrating an illuminant comprising an inorganic luminescent particle including a core and a shell and having doped metal components on a surface thereof, and an (iso) quinoline-based ligand coordinated to the metal component in accordance with an exemplary aspect of the present disclosure.

As illustrated in FIG. 7, an inorganic illuminant 300 comprises an inorganic luminescent particle 310 having at least one metal component "$M_1$" and "$M_2$" on a surface thereof, and an (iso) quinoline-based ligand 320 coordinated to the at least one metal component "$M_1$" and "$M_2$".

The inorganic luminescent particle 310 may comprise an inorganic luminescent nano particle such as QD or QR. As an example, the inorganic luminescent particle 310 may comprise a core 312 and a shell 314 enclosing the core 312. Each of the core 312 and the shell 314 may have a single layered core and a single layered shell, respectively. Alternatively, each of the core 312 and the shell 314 may have multiple layered cores and multiple layered shells, respectively. The inorganic luminescent particle 310 may have type I core/shell structure, type II core/shell structure or reverse type I core/shell structure.

Each of the core 312 and shell 314 may comprise semiconductor nanocrystals and/or metal oxide nanocrystals having quantum confinement effect. For example, the semiconductor nanocrystals of the core 312 may be selected from the group, but is not limited to, consisting of Group II-VI compound semiconductor nanocrystals, Group III-V compound semiconductor nanocrystals, Group IV-VI compound semiconductor nanocrystals, Group I-III-VI compound semiconductor nanocrystals and combination thereof.

Particularly, Group II-VI compound semiconductor nanocrystals of the core 312 may be selected from the group, but is not limited to, consisting of MgS, MgSe, MgTe, CaS, CaSe, CaTe, SrS, SrSe, SrTe, BaS, BaSe, BaTe, ZnS, ZnSe, ZnTe, ZnSeS, ZnTeSe, ZnO, CdS, CdSe, CdTe, CdSeS, CdZnS, CdSeTe, CdO, HgS, HgSe, HgTe, CdZnTe, HgCdTe, HgZnSe, HgZnTe, CdS/ZnS, CdS/ZnSe, CdSe/ZnS, CdSe/ZnSe, ZnSe/ZnS, ZnS/CdSZnS, CdS/CdZnS/ZnS, ZnS/ZnSe/CdSe and combination thereof.

Group III-V compound semiconductor nanocrystals of the core 312 may be selected from the group, but is not limited to, consisting of AlN, AlP, AlAs, AlSb, GaN, GaP, $Ga_2O_3$, GaAs, GaSb, InN, $In_2O_3$, InP, InAs, InSb, AlGaAs, InGaAs, InGaP, AlInAs, AlInSb, GaAsN, GaAsP, GaAsSb, AlGaN, AlGaP, InGaN, InAsSb, InGaSb, AlGaInP, AlGaAsP, InGaAsP, InGaAsSb, InAsSbP, AlInAsP, AlGaAsN, InGaAsN, InAlAsN, GaAsSbN, GaInNAsSb and combination thereof.

Group IV-VI compound semiconductor nanocrystals of the core 312 may be selected from the group, but is not limited to, consisting of $TiO_2$, $SnO_2$, SnS, $SnS_2$, SnTe, PbO, $PbO_2$, PbS, PbSe, PbTe, PbSnTe and combination thereof. Also, Group I-III-VI compound semiconductor nanocrystals of the core 312 may be selected from the group, but is not limited to, $AgGaS_2$, $AgGaSe_2$, $AgGaTe_2$, $AgInS_2$, $CuInS_2$, $CuInSe_2$, $Cu_2SnS_3$, $CuGaS_2$, $CuGaSe_2$ and combination thereof. Alternatively, the core 312 may include multiple layers each of which has different Groups compound semiconductor nanocrystals, e.g., Group II-VI compound semiconductor nanocrystals and Group III-V compound semiconductor nanocrystals such as InP/ZnS, InP/ZnSe, GaP/ZnS, and the likes.

In another aspect, the metal oxide nanocrystals of the core 212 may comprise, but is not limited to, Group II or Group III metal oxide nanocrystals. As an example, the metal oxide nanocrystals of the core 212 may be selected from the group, but is not limited to, MgO, CaO, SrO, BaO, $Al_2O_3$ and combination thereof.

The shell 314 may comprise, but is not limited to, semiconductor nanocrystals and/or metal oxide nanocrystals as the core 312. In one aspect, the shell 314 may comprise a first compound including the first metal component "$M_1$" and a second compound doped with the first compound and including the second metal component "$M_2$". As an example, each of the first and second compounds may be semiconductor nanocrystals and/or metal oxide nanocrystals each of which includes the first and second metal components "$M_1$" and "$M_2$", respectively.

Each of the first and second metal components "$M_1$" and "$M_2$" may form coordinated bonds with the (iso) quinoline-based ligand 320 to emit light of particular wavelength ranges. As an example, the first metal component "$M_1$" may form coordinated bonds with the (iso) quinoline-based ligand 320 to emit blue (B) light between about 460 and about 520 nm wavelength ranges, while the second metal component "$M_2$" may form coordinated bonds with the (iso) quinoline-based ligand 320 to emit green (G) light between about 500 and about 550 nm wavelength ranges. The first metal component "$M_1$" may comprise, but is not limited to, at least one of zinc (Zn), magnesium (Mg) and cadmium (Cd), while the second metal component "$M_2$" may comprise, but is not limited to, at least one of calcium (Ca) and aluminum (Al).

In an exemplary aspect, the first compound including the first metal component "$M_1$" may comprise, but is not limited to, i) Group II-VI compound semiconductor nanocrystals selected from the group consisting of MgS, MgSe, MgTe, ZnS, ZnSe, ZnTe, ZnSeS, ZnTeSe, ZnO, CdS, CdSe, CdTe, CdSeS, CdZnS, CdSeTe, CdO, CdZnTe, HgCdTe, HgZnSe, HgZnTe, CdS/ZnS, CdS/ZnSe, CdSe/ZnS, CdSe/ZnSe, ZnSe/ZnS, ZnS/CdSZnS, CdS/CdZnS/ZnS, ZnS/ZnSe/CdSe and combination thereof; ii) multiple-layered semiconductor nanocrystals, e.g. Group II-VI compound semiconductor nanocrystals-Group III-V compound semiconductor nanocrystals such as InP/ZnS, InP/ZnSe, GaP/ZnS, and the likes; and/or iii) metal oxide nanocrystals such as MgO.

Alternatively, the second compound doped with the first compound may comprise, but is not limited to, i) metal cation such as $Ca^{2+}$ and/or $Al^{3+}$; ii) Group II-VI compound semiconductor nanocrystals selected from the group consisting of CaS, CaSe, CaTe and combination thereof; iii) Group III-V compound semiconductor nanocrystals selected from the group consisting of AlN, AlP, AlAs, AlSb, AlGaAs, AlInAs, AlInSb, AlGaN, AlGaP, AlGaInP, AlGaAsP, AlInAsP, AlGaAsN, InAlAsN and combination thereof; and/or iv) metal oxide nanocrystals such as CaO, $Al_2O_3$ and combination thereof.

In another exemplary aspect, the shell 314 may comprise a first compound including the second metal component "$M_2$" that forms coordinated bonds with the (iso) quinoline-based ligand 320 to emit green (G) light, and a second compound doped with the first compound and including the first metal component "$M_1$" that forms coordinated bonds with the (iso) quinoline-based ligand 320 to emit blue (B) light. In this case, the first metal component "$M_1$" may comprise at least one of Zn, Mg and Cd, while the second metal component "$M_2$" may comprise at least one of Ca and Al.

In this exemplary aspect, the first compound including the second metal component "$M_2$" may comprise, but is not limited to, i) Group II-VI compound semiconductor nanocrystals selected from the group consisting of CaS, CaSe, CaTe and combination thereof; ii) Group III-V compound semiconductor nanocrystals selected from the group consisting of AlN, AlP, AlAs, AlSb, AlGaAs, AlInAs, AlInSb, AlGaN, AlGaP, AlGaInP, AlGaAsP, AlInAsP, AlGaAsN, InAlAsN and combination thereof; and/or iii) metal oxide nanocrystals such as CaO, $Al_2O_3$ and combination thereof.

The second compound doped with the first compound may comprise, but is not limited to, i) metal cation such as $Zn^{2+}$, $Mg^{2+}$ and/or $Cd^{2+}$; ii) Group III-VI compound semiconductor nanocrystals selected from the group consisting of MgS, MgSe, MgTe, ZnS, ZnSe, ZnTe, ZnSeS, ZnTeSe, ZnO, CdS, CdSe, CdTe, CdSeS, CdZnS, CdSeTe, CdO, CdZnTe, HgCdTe, HgZnSe, HgZnTe, CdS/ZnS, CdS/ZnSe, CdSe/ZnS, CdSe/ZnSe, ZnSe/ZnS, ZnS/CdSZnS, CdS/CdZnS/ZnS, ZnS/ZnSe/CdSe and combination thereof; iii) multiple-layered semiconductor nanocrystals, e.g. Group II-VI compound semiconductor nanocrystals-Group m-V compound semiconductor nanocrystals such as InP/ZnS, InP/ZnSe, GaP/ZnS, and the likes; and/or iv) metal oxide nanocrystals such as MgO.

The semiconductor nanocrystals of the core 312 and/or the shell 314 may be doped with a rare earth element such as Eu, Er, Tb, Tm, Dy or an arbitrary combination thereof or may be doped with a transition metal element such as Mn, Cu, Ag, Al or an arbitrary combination thereof. In an exemplary aspect, the inorganic luminescent particle 310 may comprise alloy QD or alloy QR such as homogenous alloy QD or QR or gradient alloy QD or QR, e.g. $CdS_xSe_{1-x}$, $CdSe_xTe_{1-x}$, $Cd_xZn_{1-x}S$, $Zn_xCd_{1-x}Se$, $Cu_xIn_{1-x}S$, $Cu_xIn_{1-x}Se$, $Ag_xIn_{1-x}S$.

Hereinafter, the ligand coordinated to first metal component "$M_1$" to emit blue (B) light will be referred as a first ligand 320A, while the ligand coordinated to the second metal component "$M_2$" to emit green (G) light will be referred as a second ligand 320B for the convenience of explanations. Unlike the illuminants 100 and 200, an inorganic illuminant 300 has both the first and second metal components "$M_1$" and "$M_2$", each of which forms coordinated bonds with each of the (iso) quinoline-based ligand 320A and 320B, on the surface of the shell 314.

Figure 8:
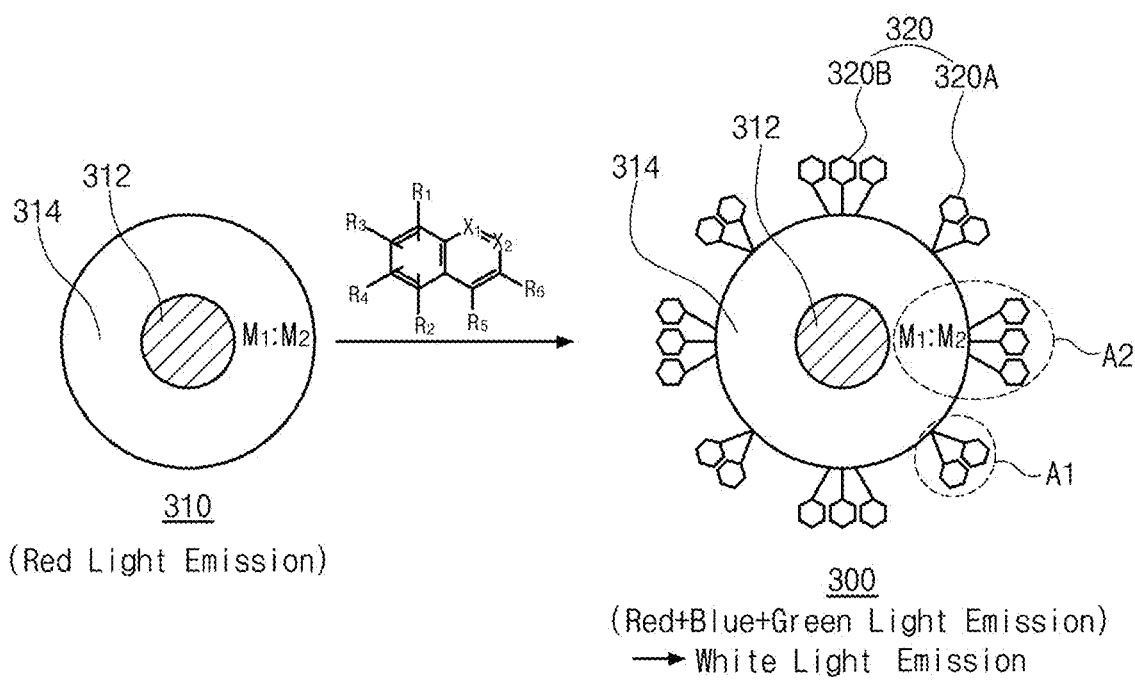
FIG. 8 is a schematic diagram illustrating a state of implementing white luminescence using an illuminant including an inorganic luminescent particle having doped metal component on a surface thereof, and an (iso) quinoline-base ligand coordinated to the metal components in accordance with an exemplary aspect of the present disclosure.

Accordingly, only one inorganic luminescent particle 310 enables white luminescence. FIG. 8 illustrates a state of implementing white luminescence using an illuminant forming coordinated bonds between the metal components on the surface of the inorganic luminescent particle and the (iso) quinoline-based ligands. Each of the moiety of the metal components and the (iso) quinoline-based ligands coordinated each of the metal components emit blue or green (G) light in FIG. 8.

As illustrated in FIG. 8, the inorganic luminescent particle 310 may comprise a core 312 and a shell 314 enclosing the core 312 and having the metal components "$M_1$" and "$M_2$". The inorganic luminescent particles 310 may have a type I, a type □ or a reverse type I "core 312/shell 314" structure, as described above. Alternatively, the inorganic luminescent particle 310 may be an alloy QD or an alloy QR. We will explain the illuminant 300 focusing on the type I QD or QR where the core 310 is illuminated as the inorganic luminescent particle 310, referring to FIG. 8. Each of the core 312 and the shell 314 may comprise semiconductor nanocrystals and/or metal oxide nanoparticles, as described above.

The red (R) light emitting inorganic luminescent particle 310 comprise the core 312 emitting red (R) light, the shell 314 enclosing the core 312 and having both the first and second metal components "$M_1$" and "$M_2$" on the surface thereof. As an example, the first metal component "$M_1$" comprise, but is not limited to, at least one of zinc (Zn), magnesium (Mg) and cadmium (Cd), while the second metal component "$M_2$" comprise, but is not limited to, at least one of calcium (Ca) and aluminum (Al). The first metal component "$M_1$" on the surface of the shell 314 reacts with the first (iso) quinoline-based compound 320A having the structure of Chemical Formulae 1 and 2 so as to form coordinated bonds between the first metal component "$M_1$" on the surface of the shell 314 and the first ligand 320A, and the second metal component "$M_2$" on the surface of the shell 314 reacts with the second (iso) quinoline-based compound 320B having the structure of Chemical Formulae 1 and 2 so as to form another coordinated bonds between the second metal component "$M_2$" on the surface of the shell 314 and the second ligand 320B, and thereby fabricating the illuminant 300.

In this case, the moiety "A1" having the first metal component "$M_1$" and the first ligand 320A coordinated to the first metal component "$M_1$" emits blue (B) light between about 460 nm and about 520 nm of wavelength ranges, while the moiety "A2" having the second metal component "$M_2$" and the second ligand 320B coordinated to the second metal component "$M_2$" emits green (G) light between about 500 and about 550 nm of wavelength ranges. Accordingly, the inorganic illuminant 300 emits three kinds of lights having different luminescent wavelength ranges, i.e., red (R) light at the core 312, blue (B) light at the moiety "A1" forming coordination bonds between the first metal component "$M_1$" and the first ligand 320A and green (G) light at the moiety "A2" forming another coordination bonds between the second metal component "$M_2$" and the second ligand 320B so that it can implement white luminescence.

Light-Emitting Diode and Light-Emitting Device

The inorganic illuminant of the present disclosure has at least one moiety that forms coordinated bonds between the at least one metal components on the surface of the inorganic luminescent particle and the (iso) quinoline-based ligands and that emits light different from the light emitted by the particle, and thereby implementing white luminescence. Accordingly, a light-emitting diode or a light-emitting device may adopt the inorganic illuminant so as to implement white luminescence.

Figure 9:
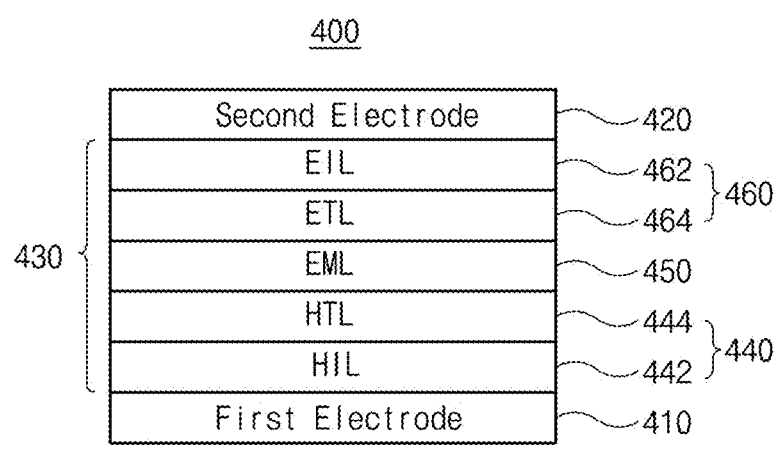
FIG. 9 is a schematic cross-sectional view illustrating a light-emitting diode with a normal structure having an illuminant that implement while light emission in accordance with an exemplary aspect of the present disclosure.

FIG. 9 is a schematic cross-sectional view of a light-emitting diode with a normal structure having an illuminant that implement while light emission in accordance with an exemplary aspect of the present disclosure. As illustrated in FIG. 9, the light-emitting diode (LED) 400 in accordance with an exemplary aspect comprise a first electrode 410, a second electrode 420 facing with the first electrode 410, and an emission layer 430 as an emissive unit between the first and second electrodes 410 and 420 and including an emitting material layer EML 450. The emission layer 430 may further comprise a first charge transfer layer 410 disposed between the first electrode and the EML 450 and a second charge transfer layer 460 disposed between the EML 450 and the second electrode 420.

The first electrode 410 may be an anode such as a hole injection electrode. The first electrode 410 may be located over a substrate (not shown in FIG. 9) that may be a glass or a polymer. As an example, the first electrode 410 may comprise, but is not limited to, a doped or undoped metal oxide such as indium-tin-oxide (ITO), indium-zinc-oxide (IZO), indium-tin-zinc oxide (ITZO), indium-copper-oxide (ICO), tin oxide ($SnO_2$), indium oxide ($In_2O_3$), cadmium: zinc oxide (Cd:ZnO), fluorine:tin oxide ($F:SnO_2$), indium: tin oxide ($In:SnO_2$), gallium:tin oxide ($Ga:SnO_2$) or aluminum:zinc oxide (Al:ZnO; AZO). Optionally, the first electrode 410 may comprise a metal or nonmetal material such as nickel (Ni), platinum (Pt), gold (Au), silver (Ag), iridium (Ir) or a carbon nanotube (CNT), other than the above-described metal oxide.

The second electrode 420 may be a cathode such as an electron injection electrode. As an example, the second electrode 420 may comprise, but is not limited to, Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg. As an example, each of the first electrode 410 and the second electrode 420 may have a thickness of about 30 to about 300 nm.

In one exemplary aspect, in case the LED 300 is a bottom emission-type light-emitting diode, the first electrode 410 may comprise, but is not limited to, a transparent conductive metal oxide such as ITO, IZO, ITZO or AZO, and the second electrode 420 may comprise, but is not limited to, Ca, Ba, Ca/Al, LiF/Ca, LiF/Al, $BaF_2$/Al, Al, Mg, or an Ag:Mg alloy.

The first charge transfer layer 440 is disposed between the first electrode 410 and the EML 450. In this exemplary aspect, the first charge transfer layer 440 may be a hole transfer layer that provides holes to the EML 450. As an example, the first charge transfer layer 440 may include a hole injection layer (HIL) 742 disposed adjacently to the first electrode 410 between the first electrode 410 and the EML 450, and a hole transport layer (HTL) 444 disposed adjacently to the EML 450 between the first electrode 410 and the EML 450.

The HIL 442 facilitates the injection of holes from the first electrode 410 into the EML 750. As an example, the HIL 442 may comprise, but is not limited to, an organic material selected from the group consisting of poly(ethylenedioxythiophene):polystyrenesulfonate (PEDOT:PSS); 4,4',4"-tris (diphenylamino)triphenylamines (TDATA) doped with tetrafluoro-tetracyano-quinodimethane (F4-TCNQ); p-doped phthalocyanine such as zinc phthalocyanine (ZnPc) doped with F4-TCNQ; N,N'-diphenyl-N,N'-bis(1-naphthyl)-1,1'-biphenyl-4,4"-diamine (α-NPD) doped with F4-TCNQ; hexaazatriphenylene-hexanitrile (HAT-CN); and a combination thereof. As an example, the dopant such as F4-TCNQ may comprise about 1 to about 30% by weight in the HIL 442. The HIL 442 may be omitted in compliance with a structure of the LED 400.

The HTL 444 transport holes from the first electrode 410 to the EML 450. The HTL 444 may comprise an inorganic material or an organic material. As an example, in case the HTL 444 comprise an organic material, the HTL 444 may comprise, but is not limited to, 4,4'-bis(p-carbazolyl)-1,1'-biphenyl compounds such as 4,4'-N,N'-dicarbazolyl-biphenyl (CBP); aryl amines, i.e. aromatic amines or polynuclear aromatic amines selected from the group consisting of N,N'-diphenyl-N,N'-bis(1-naphtyl)-1,1'-biphenyl-4,4"-diamine (c-NPD), N,N'-diphenyl-N,N'-bis(3-methylphenyl)-(1,1'-biphenyl)-4,4'-diamine (TPD), N,N'-bis(3-methylphenyl)-N,N'-bis(phenyl)-spiro (spiro-TPD), N,N'-di(4-(N,N'-diphenyl-amino)phenyl)-N,N'-diphenylbenzidine (DNTPD), 4,4',4"-tris(N-carbazolyl)-triphenylamine (TCTA), tetra-N-phenylbenzidine (TPB), tris(3-methylphenylamino)-triphenylamine (m-MTDATA), poly(9,9'-dioctylfluorenyl-2,7-diyl)-co-(4,4'-(N-(4-sec-butylphenyl) diphenylamine (TFB), poly(4-butylphenyl-dipnehyl amine)

(poly-TPD) and combination thereof; conductive polymers such as polyaniline, polypyrrole, PEDOT:PSS, poly(N-vinylcarbazole) (PVK) and its derivatives, poly(para)phenylene vinylenes (PPV) and its derivatives such as poly[2-methoxy-5-(2-ethylhexyloxy)-1,4-phenylene vinylene] (MEH-PPV), poly[2-methoxy-5-(3',7'-dimethyloctyloxy)-1,4-phenylene vinylene] (MOMO-PPV), polymethacrylate and its derivatives, poly(9,9-octylfluorene) and its derivatives, poly(spiro-fluorne) and its derivatives; metal complexes such as copper phthalocyanine (CuPC); and combination thereof.

Alternatively, in case the HTL 444 comprise an inorganic material, the HTL 444 may comprise, but is not limited to, a metal oxide such as NiO, $MoO_3$, $Cr_2O_3$, $Bi_2O_3$ or p-type ZnO; a non-oxide equivalent such as copper thiocyanate (CuSCN), $Mo_2S$, or p-type GaN; and combination thereof.

In FIG. 9, while the first charge transfer layer 440 is divided into the HIL 442 and the HTL 444, the first charge transfer layer 440 may have a mono-layered structure. For example, the first charge transfer layer 440 may comprise only the HTL 444 without the HIL 442 or may include the above-mentioned hole transporting material doped with the hole injection material (e.g. PEDOT:PSS).

The first charge transfer layer 440 including the HIL 442 and the HTL 444 may be laminated by any vacuum deposition process such as vacuum vapor deposition and sputtering, by any solution process such as spin coating, drop coating, dip coating, spray coating, roll coating, flow coating, casting, screen printing and inkjet printing, or a combination thereof. For example, each of the HIL 442 and the HTL 444 may have a thickness between about 10 nm and 200 nm, or about 10 nm and 100 nm, but is not limited thereto.

The EML 450 may comprise an illuminant 100, 200 or 300 (see, FIGS. 1, 4 and 7) the inorganic luminescent particle 110, 210 or 310 (See, FIGS. 1, 4 and 7) having at least one metal component "M", "$M_1$" and/or "$M_2$" (See, FIGS. 1, 4 and 7) on the surface thereof, and the ligand 120, 220 or 320 (See, FIGS. 1, 4 and 7) coordinated to the at least one metal component "M", "$M_1$" or "$M_2$". The inorganic luminescent particle may comprise QD or QR.

In an exemplary aspect, the inorganic luminescent particle 110 or 310 (See, FIGS. 1 and 7) may have the heterologous structure of the core 112 or 312 (See, FIGS. 1 and 7) and the shell 114 or 314 (See, FIGS. 1 and 7). The at least one metal component "M" (See, FIG. 1) may be on the surface of the shell 114. In another exemplary aspect, the inorganic luminescent particle 210 (See, FIG. 4) may comprise the core 212 (See, FIG. 4), the core shell (See, FIG. 4) enclosing the core 212, and the coating 216 (See, FIG. 4) enclosing the shell 214 and having the at least one metal component "M" may be on the surface thereof (See, FIG. 4). In still another exemplary aspect, mutually different multiple metal components "$M_1$" and "$M_2$" may be on the surface of the shell 314 (See, FIG. 7).

In one exemplary aspect, when the EML 450 implements white luminescence, the EML 450 may comprise the illuminant 100A or 200A (See, FIGS. 2 and 5) emitting red and blue (B) lights and the illuminant 100B or 200B (See, FIGS. 2 and 5) emitting green and blue (B) lights.

In another exemplary aspect, the EML may comprise the illuminant 100C or 200C (See, FIGS. 3 and 6) emitting red and green (G) lights and the illuminant 100D or 200D (See, FIGS. 3 and 6) emitting blue and green (G) lights so as to implement white luminescence. In still another exemplary aspect, the EML 450 may comprise the illuminant 300 (See, FIGS. 7 and 8) emitting red, green and blue (B) lights.

In one exemplary aspect, the EML 450 may be laminated through solution process, i.e. coating the dispersion solution, which contains the illuminant 100, 200 or 300 including the inorganic luminescent particle 110, 210 or 310 having the at least one metal component "M", "$M_1$" and/or "$M_2$" on the surface thereof and the ligand 120, 220 or 320 coordinated to the at least metal component "M", "$M_1$" and/or "$M_2$" in the solvent" on the first charge transfer layer 440, and evaporating the solvent. The EML 450 may be laminated on the first charge transfer layer 440 using solution process such as spin coating, drop coating, dip coating, spray coating, roll coating, flow coating casting, screen printing and inkjet printing, or a combination thereof. The EML 450 may have a thickness between about 5 nm and 300 nm, or about 10 nm and 20 nm, but is not limited thereto.

In one exemplary aspect, each of the inorganic luminescent particles 110, 210 and 310 may comprise QD or QR having photoluminescence (PL) properties at 440 nm, 530 nm, and 620 nm of wavelengths, thereby manufacturing a white LED. Optionally, the EML 450 may include luminescent particles such as QDs or QRs having any one of red, green and blue colors, and may be formed to emit any one color.

The illuminant emits first color light emitted from the inorganic luminescent particle and second or third color light emitted from the moiety forming coordination bonds between the at least one metal component on the surface of the inorganic luminescent particle and the (iso) quinoline-based ligand, which enables white luminescence to be implemented with ease. It is possible to implement white luminescence with only single emissive unit, and therefore, to lower the driving voltage of the LED and prevent the luminous life spans of the LED from being deteriorated caused by driving voltage rises.

The second charge transfer layer 460 is disposed between the EML 450 and the second electrode 420. The second charge transfer layer 460 may be an electron transport layer which provides electrons to the EML 450. In one exemplary aspect, the second charge transfer layer 460 may include an electron injection layer (EIL) 462 disposed adjacently to the second electrode 420 between the second electrode 420 and the EML 450, and an electron transport layer (ETL) 464 disposed adjacently to the EML 450 between the second electrode 420 and the EML 450.

The EIL 462 facilitates the injection of electrons from the second electrode 420 to the EML 450. For example, the EIL 762 may comprise, but is not limited to, a metal such as Al, Cd, Cs, Cu, Ga, Ge, In and/or L, which is undoped or doped with fluorine; and/or metal oxide such as titanium dioxide ($TiO_2$), zinc oxide (ZnO), zirconium oxide (ZrO), tin oxide ($SnO_2$), tungsten oxide ($WO_3$) or tantalum oxide ($Ta_2O_3$), which is undoped or doped with Al, Mg, In, Li, Ga, Cd, Cs or Cu.

The ETL 464 transfers electrons to the EML 450. The ETL 464 may comprise an inorganic material and/or an organic material. As an example, in case the ETL 464 comprises an inorganic material, the ETL 464 may comprise, but is not limited to, metal and/or non-metal oxides such as titanium dioxide ($TiO_2$), zinc oxide (ZnO), magnesium zinc oxide (ZnMgO), zirconium oxide (ZrO), tin oxide ($SnO_2$), tungsten oxide ($WO_3$), tantalum oxide ($Ta_2O_3$), hafnium oxide ($HfO_3$), aluminum oxide ($Al_2O_3$), zirconium silicon oxide ($ZrSiO_4$), barium titanium oxide ($BaTiO_3$), and barium zirconium oxide ($BaZrO_3$), each of which is undoped or doped Al, Mg, In, Li, Ga, Cd, Cs or Cu; semiconductor particles such as CdS, ZnSe and ZnS, each of which is undoped or doped with Al, Mg, In, Li, Ga, Cd, Cs or Cu; a nitride such as $Si_3N_4$; and combination thereof.

Alternatively, in case the ETL 464 comprise an organic material, the ETL 464 may comprise, but is not limited to, oxazole-based compounds, isooxazole-based compounds, triazole-based compounds, isothiazole-based compounds, oxadiazole-based compounds, thiadiazole-based compounds, phenanthroline-based compounds, perylene-based compounds, benzoxazole-based compounds, benzothiazole-based compounds, benzimidazole-based compounds, a triazine-based compounds, and aluminum complexes.

Particularly, the organic material of the ETL 464 may be selected from the group, but is not limited to, 3-(biphenyl-4-yl)-5-(4-tertbutylphenyl)-4-phenyl-4H-1,2,4-triazole (TAZ), bathocuproine (2,9-dimethyl-4,7-diphenyl-1,10-phenanthroline; BCP), 2,2',2"-(1,3,5-benzinetriyl)-tris(1-phenyl-1-H-benzimidazole); TPBi), tris(8-hydroxyquinoline)aluminum ($Alq_3$), bis(2-methyl-8-quninolinato)-4-phenylphenolatealuminum (III) (Balq), bis(2-methyl-quinolinato)(tripnehylsiloxy) aluminum (III) (Salq) and combination thereof.

Similar to the first charge transfer layer 440, while FIG. 9 illustrates the second charge transfer layer 460 as a bi-layered structure including the EIL 462 and the ETL 464, the second charge transfer layer 460 may have a mono-layered structure only of the ETL 464. Alternatively, the second charge transfer layer 460 may have a mono-layered structure of ETL 464 including a blend of the above-described electron-transporting inorganic material with cesium carbonate.

The second charge transfer layer 460 including the EIL 462 and/or the ETL 464 may be laminated on the EML 450 through solution process such as spin coating, drop coating, dip coating, spray coating, roll coating, flow coating, casting, screen printing and inkjet printing, or combination thereof. As an example, each of the EIL 462 and the ETL 464 may have a thickness between about 10 nm and about 200 nm, or about 10 nm and 100 nm, but is not limited thereto.

For example, the LED 400 may have a hybrid charge transfer layer (CTL) in which the HTL 444 of the first charge transfer layer 440 comprises the organic material as describe above and the second charge transfer layer 460, for example, the ETL 464 comprises the inorganic material as described above, or vice versa. In this case, The LED 400 may enhance its luminous properties.

When holes are transported to the second electrode 420 through the EML 450, or electrons are transported to the first electrode 410 through the EML 450, the lifespan and efficiency of the LED 400 may be reduced. To prevent such deterioration, the LED 400 may further include at least one exciton blocking layer disposed adjacently to the EML 450.

For example, the LED 400 may include an electron blocking layer (EBL) capable of controlling and preventing the transfer of electrons between the HTL 444 and the EML 450. As an example, the EBL may comprise, but is not limited to, TCTA, tris[4-(diethylamino)phenyl]amine), N-(biphenyl-4-yl)-9,9-dimethyl-N-(4-(9-phenyl-9H-carbazole-3-yl)phenyl)-9H-fluorene-2-amine, tri-p-tolylamine, 1,1-bis(4-(N,N'-di(ptolyl)amino)phenyl)cyclohexane (TAPC), m-MTDATA, 1,3-bis(N-carbazolyl)benzene (mCP), 3,3'-bis(N-carbazolyl)-1,1'-biphenyl (mCBP), Poly-TPD, copper phthalocyanine (CuPc), DNTPD and/or 1,3,5-tris[4-(diphenylamino)phenyl]benzene (TDAPB), combination thereof.

Besides, a hole blocking layer (HBL), as a second exciton blocking layer, may be disposed between the EML 450 and the ETL 464 to prevent the transfer of holes between the EML 450 and the ETL 464. In one exemplary aspect, the HBL may comprise, but is not limited to, oxadiazole-based compounds, triazole-based compounds, phenanthroline-based compounds, benzoxazole-based compounds, benzothiazole-based compounds, benzimidazole-based compounds, triazine-based compounds, and the likes, which may be used for the ETL 464.

For example, the HBL may comprise, but is not limited to, 2,9-dimethyl-4,7-diphenyl-1,10-phenanthroline (BCP), BAlq, Alq3, PBD, spiro-PBD and/or Liq, which have/has a deeper highest occupied molecular orbital (HOMO) energy level than that of the material used for the EML 450.

FIG. 9 illustrates an LED having a normal structure, in which the HTL is disposed between the first electrode having a relatively low work function and the EML, and the ETL is disposed between the second electrode having a relatively high work function and the EML. The LED may have an inverted structure, rather than the normal structure, and will be described.

Figure 10:
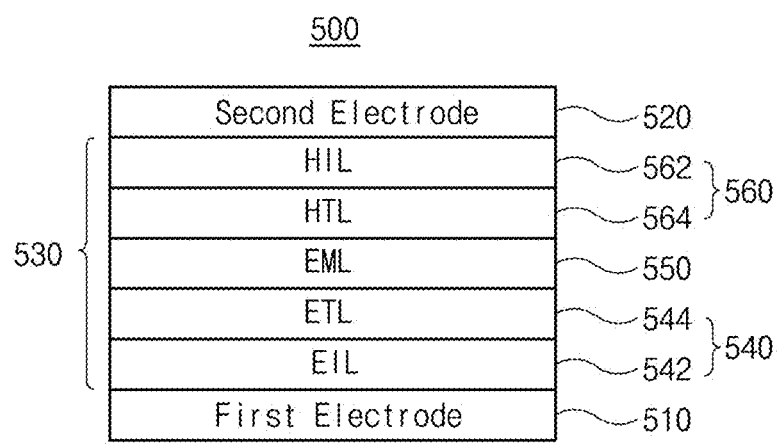
FIG. 10 is a schematic cross-sectional view illustrating a light-emitting diode with an inverted structure having an illuminant that implement while light emission in accordance with an exemplary aspect of the present disclosure.

FIG. 10 is a schematic cross-sectional view of a light-emitting diode with an inverted structure having an illuminant that implement while light emission in accordance with an exemplary aspect of the present disclosure. As illustrated in FIG. 10, the LED 500 includes a first electrode 510, a second electrode 520 facing oppositely from the first electrode 510, and an emission layer 530 disposed between the first electrode 510 and the second electrode 520 and including an EML 550. The emission layer 530 may further include a first charge transfer layer 540 disposed between the first electrode 510 and the EML 550, and a second charge transfer layer 560 disposed between the second electrode 520 and the EML 550.

In this exemplary aspect, the first electrode 510 may be a cathode such as an electron injection electrode. As an example, the first electrode 510 may comprise, but is not limited to, a doped or undoped metal oxide such as ITO, IZO, ITZO, ICO, $SnO_2$, $In_2O_3$, Cd:ZnO, $F:SnO_2$, $In:SnO_2$, $Ga:SnO_2$ and AZO, or a material such as Ni, Pt, Au, Ag, Ir or a CNT, other than the above-described metal oxide.

The second electrode 520 may be an anode such as a hole injection electrode. As an example, the second electrode 520 may comprise, but is not limited to, Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg. For example, each of the first electrode 510 and the second electrode 520 may have a thickness of about 30 nm to about 300 nm.

In this exemplary aspect, the first charge transfer layer 540 may be an electron transfer layer that provides electrons to the EML 550. In one exemplary aspect, the first charge transfer layer 540 includes an EIL 542 disposed adjacently to the first electrode 510 between the first electrode 510 and the EML 550, and an ETL 544 disposed adjacently to the EML 550 between the first electrode 510 and the EML 550.

The EIL 542 may comprise, but is not limited to, a metal such as Al, Cd, Cs, Cu, Ga, Ge, In or Li, which is undoped or doped with fluorine; and/or metal oxide (e.g., $TiO_2$, ZnO, ZrO, $SnO_2$, $WO_3$, or $Ta_2O_3$), which is undoped or doped with Al, Mg, In, Li, Ga, Cd, Cs or Cu.

The ETL 544 may comprise an inorganic material and/or an organic material. As an example, in case the ETL 544 comprises an inorganic material, the ETL 544 may comprise, but is not limited to, metal/non-metal oxides such as $TiO_2$, ZnO, ZrO, $SnO_2$, $WO_3$, $Ta_2O_3$, $HfO_3$, $Al_2O_3$, $ZrSiO_4$, $BaTiO_3$, and $BaZrO_3$, each of which is undoped or doped with Al, Mg, In, Li, Ga, Cd, Cs or Cu; semiconductor particles such as CdS, ZnSe and ZnS, each of which is undoped or doped with Al, Mg, In, Li, Ga, Cd, Cs or Cu; a nitride such as $Si_3N_4$, and combination thereof.

Alternatively, in case the ETL 544 comprises an organic material, the ETL 544 may comprise, but is not limited to, oxazole-based compounds, isooxazole-based compounds, triazole-based compounds, isothiazole-based compounds, oxadiazole-based compounds, thiadiazole-based compounds, phenanthroline-based compounds, perylene-based compounds, benzoxazole-based compounds, benzothiazole-based compounds, benzimidazole-based compounds, a triazine-based compounds, and aluminum complexes. Particularly, the organic material of the ETL 544 may be selected from the group, but is not limited to, consisting of TAZ, BCP, TPBi, 2-[4-(9,10-di-2-naphthalenyl-2-anthracenyl) phenyl]-1-phenyl-1H-benzimidazole, $Alq_3$, Balq, LIQ, Salq and combination thereof.

Unlike the first charge transfer layer 440 illustrated in FIG. 10, the first charge transfer layer 440 may have a mono-layered structure only of the ETL 544. Alternatively, the second charge transfer layer 540 may have a mono-layered structure of ETL 544 including a blend of the above-described electron-transporting inorganic material with cesium carbonate. The first charge transfer layer 546 including the EIL 542 and/or the ETL 544 may be laminated on the first electrode 510 through solution process. As an example, each of the EIL 546 and the ETL 544 may have a thickness between about 10 nm and about 200 nm, or about 10 nm and 100 nm, but is not limited thereto.

The EML 550 may comprise an illuminant 100, 200 or 300 (see, FIGS. 1, 4 and 7), that includes the inorganic luminescent particle 110, 210 or 310 (See, FIGS. 1, 4 and 7) having at least one metal component "M", "$M_1$" and/or "$M_2$" (See, FIGS. 1, 4 and 7) on the surface thereof, and the ligand 120, 220 or 320 (See, FIGS. 1, 4 and 7) coordinated to the at least one metal component "M", "$M_1$" or "$M_2$". The inorganic luminescent particle may comprise QD or QR.

In an exemplary aspect, the inorganic luminescent particle 110 or 310 (See, FIGS. 1 and 7) may have the heterologous structure of the core 112 or 312 (See, FIGS. 1 and 7) and the shell 114 or 314 (See, FIGS. 1 and 7). The at least one metal component "M" may be on the surface of the shell 114 (See, FIG. 1). In another exemplary aspect, the inorganic luminescent particle 210 (See, FIG. 4) may comprise the core 212 (See, FIG. 4), the shell 214 (See, FIG. 4) enclosing the core 212, and the coating 216 (See, FIG. 4) enclosing the shell 214 and having the at least one metal component "M" may be on the surface thereof (See, FIG. 4). In still another exemplary aspect, mutually different multiple metal components "$M_1$" and "$M_2$" may be on the surface of the shell 314 (See, FIG. 7).

In one exemplary aspect, the EML 550 may comprise the illuminant 100A or 200A (See, FIGS. 2 and 5) emitting red and blue (B) lights and the illuminant 100B or 200B (See, FIGS. 2 and 5) emitting green and blue (B) lights so as to white luminescence.

In another exemplary aspect, the EML 550 may comprise the illuminant 100C or 200C (See, FIGS. 3 and 6) emitting red and green (G) lights and the illuminant 100D or 200D (See, FIGS. 3 and 6) emitting blue and green (G) lights so as to implement white luminescence. In still another exemplary aspect, the EML 550 may comprise the illuminant 300 (See, FIGS. 7 and 8) emitting red, green and blue (B) lights.

In one exemplary aspect, the EML 550 may be laminated through solution process, i.e. coating the dispersion solution, which contains the illuminant 100, 200 or 300 including the inorganic luminescent particle 110, 210 or 310 having the at least one metal component "M", "$M_1$" and/or "$M_2$" on the surface thereof and the ligand 120, 220 or 320 coordinated to the at least metal component "M", "$M_1$" and/or "$M_2$" in the solvent" on the first charge transfer layer 440, and evaporating the solvent. The EML 550 may be laminated on the first charge transfer layer 540 using solution process such as spin coating, drop coating, dip coating, spray coating, roll coating, flow coating casting, screen printing and inkjet printing, or a combination thereof. The EML 550 may have a thickness between about 5 nm and 300 nm, or about 10 nm and 20 nm, but is not limited thereto.

In one exemplary aspect, each of the inorganic luminescent particles 110, 210 and 310 may comprise QD or QR having photoluminescence (PL) properties at 440 nm, 530 nm, and 620 nm of wavelengths, thereby manufacturing a white LED. Optionally, the EML 550 may include luminescent particles such as QDs or QRs having any one of red, green and blue colors, and may be formed to emit any one color.

The illuminant emits first color light emitted from the inorganic luminescent particle and second or third color light emitted from the moiety forming coordination bonds between the at least one metal component on the surface of the inorganic luminescent particle and the (iso) quinoline-based ligand, which enables white luminescence to be implemented with ease. It is possible to implement white luminescence with only single emissive unit, and therefore, to lower the driving voltage of the LED and prevent the luminous life spans of the LED from being deteriorated caused by driving voltage rises.

In this exemplary aspect, the second charge transfer layer 560 may be a hole transfer layer providing holes to the EML 550. In one exemplary aspect, the second charge transfer layer 560 includes an HIL 562 disposed adjacently to the second electrode 520 between the second electrode 520 and the EML 550, and an HTL 564 disposed adjacently to the EML 550 between the second electrode 520 and the EML 550.

The HIL 562 may comprise, but is not limited to, a material selected from the group consisting of PEDOT:PSS, F4-TCNQ-doped TDATA, p-doped phthalocyanine (e.g., F4-TCNQ-doped ZnPc), F4-TCNQ-doped t-NPD, HAT-CN and combination thereof. As an example, the dopant such as F4-TCNQ may comprise about 1 to about 30% by weight in the HIL 562. The HIL 562 may be omitted in compliance with a structure of the LED 500.

The HTL 564 may comprise an inorganic material or an organic material. As an example, in case the HTL 564 comprise an organic material, the HTL 564 may comprise, but is not limited to, 4,4'-bis(p-carbazolyl)-1,1'-biphenyl compounds such as CBP; aryl amines, i.e. aromatic amines or polynuclear aromatic amines selected from the group consisting of α-NPD, TPD, spiro-TPD, DNTPD, TCTA, TPB, m-MTDATA, TFB, poly-TPD) and combination thereof; conductive polymers such as polyaniline, polypyrrole, PEDOT:PSS, PVK and its derivatives, PPV and its derivatives such as MEH-PPV, MOMO-PPV, polymethacrylate and its derivatives, poly(9,9-octylfluorene) and its derivatives, poly(spiro-fluorne) and its derivatives; metal complexes such as copper phthalocyanine (CuPC); and combination thereof.

Alternatively, in case the HTL 564 comprises an inorganic material, the HTL 564 may comprise, but is not limited to, a metal oxide such as NiO, $MoO_3$, $Cr_2O_3$, $Bi_2O_3$ or p-type ZnO; a non-oxide equivalent such as copper thiocyanate (CuSCN), $Mo_2S$, or p-type GaN; and combination thereof.

Unlike the second charge transfer layer 560 illustrated in FIG. 10, the second charge transfer layer 560 may have a mono-layered structure. For example, the second charge transfer layer 560 may comprise only the HTL 564 without the HIL 562 or may include the above-mentioned hole transporting material doped with the hole injection material (e.g. PEDOT:PSS). For example, each of the HIL 562 and the HTL 564 may have a thickness between about 10 nm and 200 nm, or about 10 nm and 100 nm, but is not limited thereto.

Similarly to the LED 400, the LED 500 may further include at least one exciton blocking layer disposed adjacently to the EML 550. For example, the LED 500 may include an electron blocking layer (EBL) capable of controlling and preventing the transfer of electrons between the EML 550 and the HTL 564, and/or a hole blocking layer (HBL) capable of controlling and preventing the transfer of holes between the ETL 544 and the EML 550.

Figure 11:
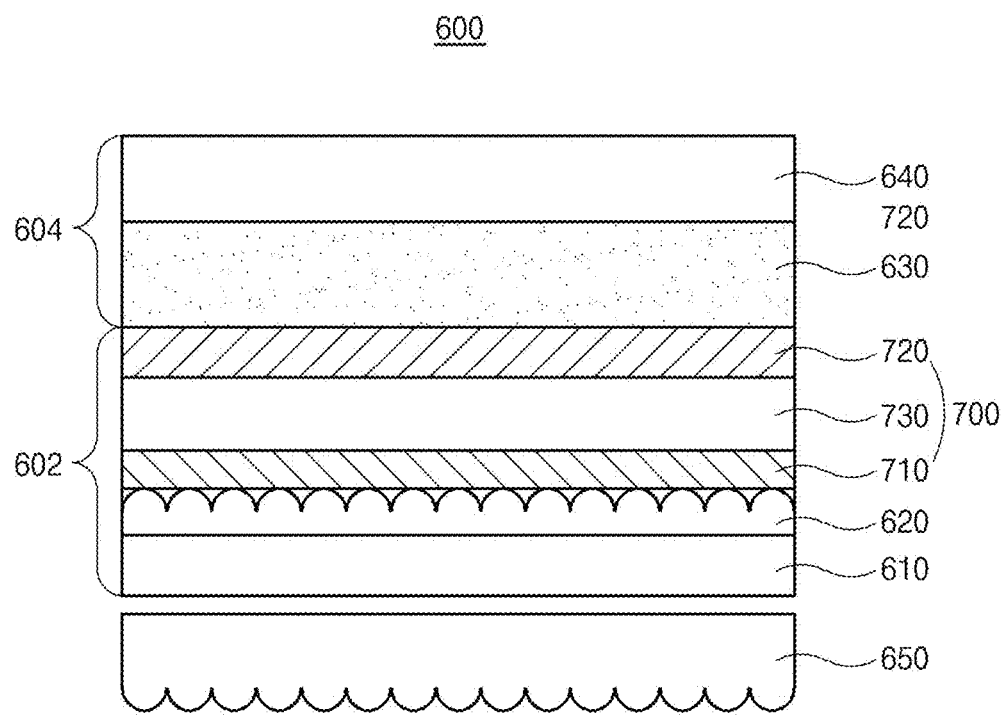
FIG. 11 is a schematic cross-sectional view illustrating a light-emitting diode illumination device that comprises a light-emitting diode in accordance with an exemplary aspect of the present disclosure.

The LEDs 400 and 500 including the EMLs 450 and 550, each of which includes the illuminant 100, 200 or 300 (See, FIGS. 1, 4 and 7), may be applied into a light-emitting device such as an illumination device or a display device. A light-emitting diode illumination device including the LEDs 400 and 500 will be explained. FIG. 11 is a schematic cross-sectional view of a light-emitting diode illumination device that comprises a light-emitting diode in accordance with an exemplary aspect of the present disclosure. As illustrated in FIG. 11, a light-emitting diode illumination device 600 includes a light-emitting diode member 602 comprising a light-emitting diode (LED) 700 disposed over a substrate 610 and an encapsulation member 604.

The substrate 610 may comprise glass, thin flexible material and/or polymer plastics. For example, the flexible material may be selected from the group, but is not limited to, polyimide (PI), polyethersulfone (PES), polyethylenenaphthalate (PEN), polyethylene terephthalate (PET), polycarbonate (PC) and combination thereof.

The LED 700 is disposed over the substrate 600. The LED 700 includes first and second electrodes 710 and 720 each of which is disposed over the whole substrate 710 and an emission layer 730 disposed between the first and second electrodes 710 and 720. Accordingly, the emissive material 730 illuminates and emits light toward the whole substrate 610 as electrical signals are applied into the first and second electrodes 710 and 720.

The first electrode 710 may be an anode or a cathode, and may comprise a conductive material having a relatively high work function. For example, the first electrode 710 may comprise, but is not limited to, undoped or doped metal oxide such as ITO, IZO, ITZO, ICO, $SnO_2$, $In_2O_3$, Cd:ZnO, F:$SnO_2$, In:$SnO_2$, Ga:$SnO_2$ or AZO, or nickel (Ni), platinum (Pt), gold (Au), silver (Ag), or iridium (Ir) or CNT, other than the above-mentioned metal oxide.

In one exemplary aspect, when the light-emitting diode illumination device 600 is a top-emission type, a reflective electrode or a reflective layer (not shown) may be disposed under the first electrode 710. For example, the reflective electrode or the reflective layer (not shown) may comprise, but is not limited to, aluminum-palladium-copper (APC) alloy.

The emission layer 730 is disposed on the first electrode 710. In one exemplary aspect, the emission layer 730 may have mono-layered structure of an EML. Alternatively, the emission layer 730 may have multiple-layered structure as illustrated in FIG. 9 or 10, and may include a first charge transfer layer 440 or 540, an EML 450 or 550 and a second charge transfer layer 460 or 560.

In an exemplary aspect, the EML may comprise the illuminant 100, 200 or 300 (See, FIGS. 1, 4 and 7). Particularly, the EML may comprise the illuminant 100, 200 or 300 including the inorganic luminescent particle 110, 210 or 310 (See, FIGS. 1, 4 and 7) having at least one metal component "M", "$M_1$" and/or "$M_2$" (See, FIGS. 1, 4 and 7) on the surface thereof, and the ligand 120, 220 or 320 (See, FIGS. 1, 4 and 7) coordinated to the at least one metal component "M", "$M_1$" or "$M_2$". The inorganic luminescent particle 110, 210 and/or 310 (See, FIGS. 1, 4 and 7) may comprise QD or QR.

In an exemplary aspect, the inorganic luminescent particle 110 or 310 (See, FIGS. 1 and 7) may have the heterologous structure of the core 112 or 312 (See, FIGS. 1 and 7) and the shell 114 or 314 (See, FIGS. 1 and 7). The at least one metal component "M" may be on the surface of the shell 114 (See, FIG. 1). In another exemplary aspect, the inorganic luminescent particle 210 (See, FIG. 4) may comprise the core 212 (See, FIG. 4), the shell 214 (See, FIG. 4) enclosing the core 212, and the coating 216 (See, FIG. 4) enclosing the shell 214 and having the at least one metal component "M" may be on the surface thereof (See, FIG. 4). In still another exemplary aspect, mutually different multiple metal components "$M_1$" and "$M_2$" may be on the surface of the shell 314 (See, FIG. 7).

In one exemplary aspect, the EML may comprise the illuminant 100A or 200A (See, FIGS. 2 and 5) emitting red and blue (B) lights and the illuminant 100B or 200B (See, FIGS. 2 and 5) emitting green and blue (B) lights so as to white luminescence.

In another exemplary aspect, the EML 550 may comprise the illuminant 100C or 200C (See, FIGS. 3 and 6) emitting red and green (G) lights and the illuminant 100D or 200D (See, FIGS. 3 and 6) emitting blue and green (G) lights so as to implement white luminescence. In still another exemplary aspect, the EML 550 may comprise the illuminant 300 (See, FIGS. 7 and 8) emitting red, green and blue (B) lights.

The second electrode 720 is disposed over the substrate 610 above which the emission layer 730 is disposed. The second electrode 720 may be disposed over the whole substrate 610, comprise a conductive material with relatively small work function value, and be a cathode or an anode. As an example, the second electrode 720 may comprise, but is not limited to, Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg.

In one alternative exemplary aspect, an auxiliary electrode (not shown) connecting to the first electrode 710 may be disposed. While the first electrode 710 comprises a transparent conductive material in order to pass through lights, the transparent conductive material has higher electrical resistance compared to metals. In case of fabricating a large-area light-emitting diode illumination device 600, high electrical resistance of the transparent material cause applied voltages to be distributed un-uniformly across the whole large emission area. It is not possible to implement evenly distributed luminance in the large-area light emitting diode illumination device 600 caused by the un-uniformly distributed voltages.

The auxiliary electrode (not shown) may have a structure such as a matrix shape of thin-width, a mesh shape, a hexagonal shape, an octagonal shape and a circular shape, and the likes, and may comprise highly conductive metals. Accordingly, voltages are applied uniformly into the first electrode 710 so as to implement uniform luminescence across the large-area light-emitting diode illumination device 600. As an example, the auxiliary electrode (not shown) may comprise, but is not limited to, highly conductive metals such as Al, Au, Cu, Ti, W, Mo and alloy thereof.

In one exemplary aspect, the auxiliary electrode (not shown) may have single-layered structure. Alternatively, the auxiliary electrode (not shown) may have double-layered structure.

An adhesive or a tackifier 630 is applied over the LED 700, and a film 640 is disposed on the adhesive layer 630 to encapsulate the light-emitting diode illumination device 600. The adhesive 630 may comprise photo-curable adhesives or thermally-curable adhesives. As an example, the adhesive 630 may comprise, but is not limited to, acrylate-based and/or epoxy-based pressure sensitive adhesives (PSA) and/or optically clear adhesives (OCA)

The film 640 may comprise various materials. The film 640 prevents outer moisture or air from filtrating into the LED 700 and may comprise may any material to achieve such a function. As an example, the film 640 may comprise a polymer such as polyethylene terephthalate (PET) or thin metal foil such as aluminum. Besides, in case the light-emitting diode illumination device 600 is fabricated with a sheet-manufacturing apparatus not a roll-manufacturing apparatus, the film 640 may comprise un-bend materials such as glass.

Besides, an encapsulation layer (not shown) may be disposed on the second electrode 730. The encapsulation layer (not shown) may comprise a first passivation layer (not shown) of an organic layer and/or an inorganic layer, and a second passivation layer (not shown) of epoxy-based compounds, acrylate-based compounds or acryl-based compounds.

Besides, the light-emitting diode illumination device 600 may further comprise an inner coupling layer 620 disposed between the substrate 610 and the LED 700 for improving an external quantum efficiency (ECE) and/or an outer coupling layer 650 disposed under the substrate 610 for increasing haze.

The inner coupling layer 620 and the outer coupling layer 650 may comprise materials having a refractive index between about 1.7 and about 3.0 so that the LED 700 may increase its out-coupling efficiency. Accordingly, it is possible to implement light-scattering effect based upon refractive indices differences between the coupling layers 620 and 650 and other layers having relatively lower refractive index.

As an example, the inner coupling layer 620 and the outer coupling layer 650 may comprise scattering particles dispersed in a binder with refractive index between about 1.7 and about 3.0. Particularly, the inner and outer coupling layers 620 and 650 may comprise a scattering layer (not shown) having prominences and depressions by scattering particles on a surface oppositely to the substrate 610 and a planarization layer (not shown) disposed on the scattering layer for flattening surface curves by the prominences and depression of the scattering layer. The planarization layer (not shown) may have refractive index higher than that of the scattering particles, for example, between about 1.7 and about 3.0.

The binder of the inner and outer coupling layers 620 and 650 may comprise organic, inorganic or organic/inorganic hybrid or composite binders and is not limited to particular binder. As an example, the binder may be an inorganic binder or organic/inorganic hybrid or composite binder. The inorganic binder or the organic/inorganic hybrid or composite binder has better heat-resistance properties, chemical-resistance properties than the organic binder. Accordingly, it is possible to increase physical and chemical properties such as lifespan of the LED 700 and to fabricate various types of diodes using the inorganic binder or the organic/inorganic hybrid or composite binder since the inorganic binder or the organic/inorganic hybrid or composite binder is not deteriorated even in high-temperature processes, photo-processes and etching process performed at 150° C. or more in the course of fabricating the LED 700.

As an example, the binder may comprise, but is not limited to, inorganic materials or organic/inorganic hybrid materials selected from silicon oxides ($SiO_x$), silicon nitrides ($SiN_x$), silicon oxide nitrides ($SiO_xN_y$), alumina ($Al_2O_3$), siloxane-based materials, and combination thereof. For example, the organic binder based upon siloxane-based materials may be fabricated by performing condensation polymerization process using siloxanes, or the organic/inorganic hybrid binders with some alkyl groups in siloxane bonds as siloxane-based materials may be used.

The scattering particle (not shown) of the inner and outer coupling layers 620 and 650 may have a globular shape, an elliptical shape or an amorphous shape, a globular shape or an elliptical shape. The scattering particle may have a mean particle size between about 100 nm and about 300 nm, or about 150 nm and about 200 nm. The scattering particle may comprise any material that can scatter lights using the refractive indices differences among the binder or the planarization layer (not shown). As an example, the scattering particle may comprise, but is not limited to, silicon, silica, glass, titanium oxide, magnesium fluoride, zirconium oxide, alumina, cerium oxide, hafnium oxide, niobium pentoxide, tantalum pentoxide, indium oxide, tin oxide, indium-tin oxide, zinc oxide, zinc sulfide, calcium carbonate, barium sulfonate, silicon nitrides, aluminum nitrides and combination thereof. For example, the scattering particle may comprise titanium dioxide.

Figure 12:
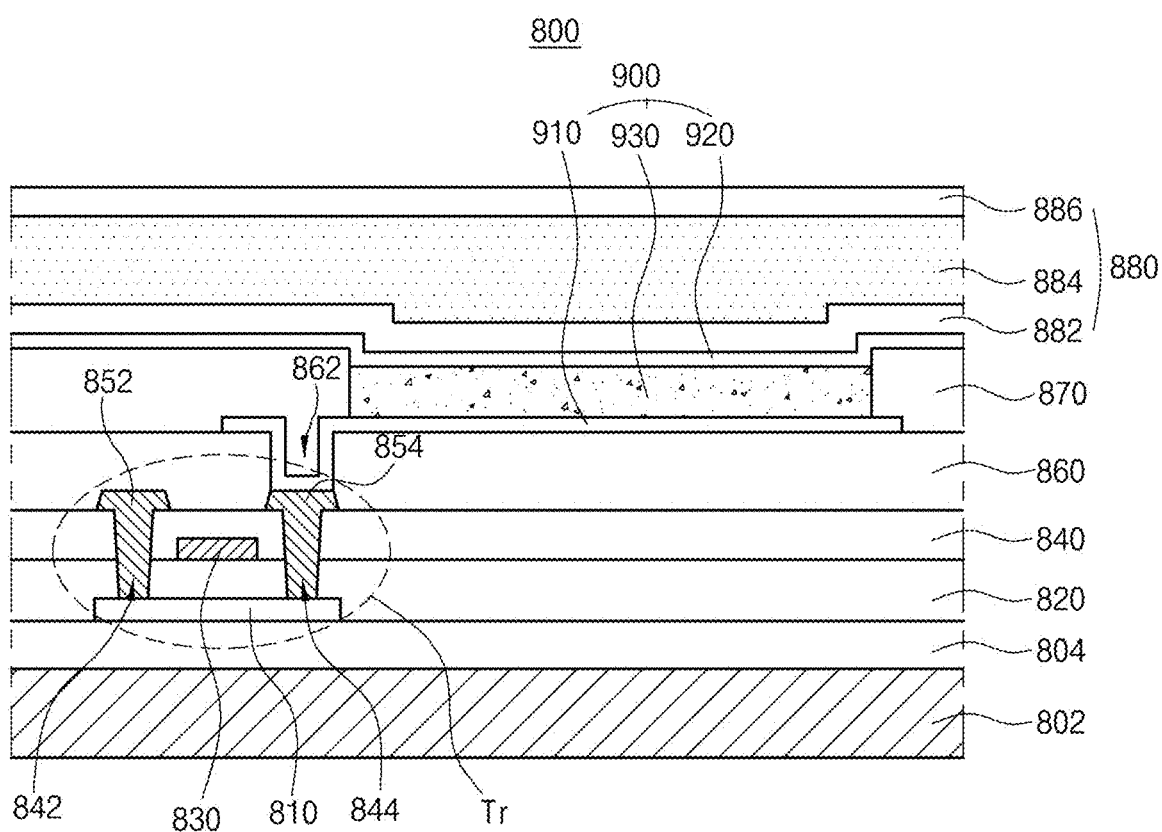
FIG. 12 is a schematic cross-sectional view of a light-emitting diode display device that comprise a light-emitting diode in accordance with an exemplary aspect of the present disclosure.

A light-emitting diode display device having a light-emitting diode that includes the illuminant 100, 200 or 300 in an EML will be explained. FIG. 12 is a schematic cross-sectional view illustrating a light-emitting diode display device as an example of a light-emitting device that comprises a light-emitting diode in accordance with an exemplary aspect of the present disclosure.

As illustrated in FIG. 12, a light-emitting diode display device 800 comprise a substrate 802, a thin-film transistor Tr on the substrate 802, and an light-emitting diode 900 connected to the thin film transistor Tr.

The substrate 902 may comprise, but is not limited to, glass, thin flexible material and/or polymer plastics. For example, the flexible material may be selected from the group, but is not limited to, polyimide (PI), polyethersulfone (PES), polyethylenenaphthalate (PEN), polyethylene terephthalate (PET), polycarbonate (PC) and combination thereof. The thin film transistor Tr, and the substrate 500, over which the organic light-emitting diode 600 is arranged, form an array substrate.

A buffer layer 804 may be disposed over the substrate 802, and the thin film transistor Tr is disposed over the buffer layer 804. The buffer layer 802 may be omitted.

A semiconductor layer 810 is disposed over the buffer layer 804. In one exemplary aspect, the semiconductor layer 810 may comprise oxide semiconductor materials. In this case, a light-shied pattern (not shown) may be disposed under the semiconductor layer 810, and the pattern (not shown) can prevent light from being incident toward the semiconductor layer 810, and thereby preventing the semiconductor layer 810 from being deteriorated by the light. Alternatively, the semiconductor layer 810 may comprise polycrystalline silicon. In this case, opposite edges of the semiconductor layer 810 may be doped with impurities.

A gate insulating film 820 comprising an insulating material is disposed on the semiconductor layer 810. The gate insulating film 820 may comprise an inorganic insulating material such as silicon oxide ($SiO_x$) or silicon nitride ($SiN_x$).

A gate electrode 830 made of a conductive material such as a metal is disposed over the gate insulating film 820 so as to correspond to a center of the semiconductor layer 810. While the gate insulating film 820 is disposed over a whole area of the substrate 802 in FIG. 12, the gate insulating film 820 may be patterned identically as the gate electrode 530.

An interlayer insulating film 840 comprising an insulating material is disposed on the gate electrode 830 with covering over the substrate 802. The interlayer insulating film 840 may comprise an inorganic insulating material such as silicon oxide ($SiO_x$) or silicon nitride ($SiN_x$), or an organic insulating material such as benzocyclobutene or photo-acryl.

The interlayer insulating film 840 has first and second semiconductor layer contact holes 842 and 844 that expose opposite top sides of the semiconductor layer 810. The first and second semiconductor layer contact holes 842 and 844 are disposed over opposite sides of the gate electrode 830 with spacing apart from the gate electrode 830. While the first and second semiconductor layer contact holes 842 and 844 are formed within the gate insulating film 820 in FIG. 12. Alternatively, the first and second semiconductor layer contact holes 842 and 844 are formed only within the interlayer insulating film 840 when the gate insulating layer 820 is patterned identically as the gate electrode 830.

A source electrode 852 and a drain electrode 844, each of which comprises a conductive material such as a metal, are disposed on the interlayer insulating film 840. The source electrode 852 and the drain electrode 844 are spaced apart from each other with respect to the gate electrode 830, and contact opposite sides of the semiconductor layer 810 through the first and second semiconductor layer contact holes 842 and 844, respectively.

The semiconductor layer 810, the gate electrode 830, the source electrode 852 and the drain electrode 854 constitute the thin film transistor Tr, which acts as a driving element. The thin film transistor Tr in FIG. 12 has a coplanar structure in which the gate electrode 830, the source electrode 852 and the drain electrode 854 are disposed over the semiconductor layer 810. Alternatively, the thin film transistor Tr may have an inverted staggered structure in which a gate electrode is disposed under a semiconductor layer and a source and drain electrodes are disposed over the semiconductor layer. In this case, the semiconductor layer may comprise amorphous silicon.

Although not shown in FIG. 12, a gate line and a data line cross each other to define a pixel area, and a switching element connected to the gate line and the data line is further formed in the pixel area. The switching element is connected to the thin film transistor Tr, which is a driving element. Besides, a power line is spaced apart in parallel from the gate line or the data line, and the thin film transistor Tr may further includes a storage capacitor configured to constantly keep a voltage of the gate electrode for one frame.

In addition, the light-emitting display device 800 may include a color filter (not shown) for absorbing a light emitted from the organic light-emitting diode 900. For example, the color filter (not shown) may absorb a light of specific wavelength such as red (R), green (G) or blue (B). In this case, the light-emitting display device 800 can implement full-color through the color filter (not shown).

For example, when the light-emitting display device 800 is a bottom-emission type, the color filter (not shown) may be disposed on the interlayer insulating film 840 with corresponding to the light-emitting diode 900. Alternatively, when the light-emitting display device 800 is a top-emission type, the color filter (not shown) may be disposed over the light-emitting diode 900, that is, a second electrode 920.

A passivation layer 860 is disposed on the source and drain electrodes 852 and 854 over the whole substrate 802. The passivation layer 860 has a flat top surface and a drain contact hole 862 that exposes the drain electrode 854 of the thin film transistor Tr. While the drain contact hole 862 is disposed on the second semiconductor layer contact hole 854, it may be spaced apart from the second semiconductor layer contact hole 854.

The light-emitting diode 900 includes a first electrode 910 that is disposed on the passivation layer 860 and connected to the drain electrode 854 of the thin film transistor Tr. The organic light-emitting diode 900 further includes an emission layer 930 and a second electrode 920 each of which is disposed sequentially on the first electrode 910.

The first electrode 910 is disposed in each pixel area. The first electrode 010 may be an anode or a cathode and comprise a conductive material with relatively high work function value. For example, the first electrode 910 may comprise, but is not limited to, a doped or undoped metal oxide such as ITO, IZO, ITZO, ICO, $SnO_2$, $In_2O_3$, Cd:ZnO, F:$SnO_2$, In:$SnO_2$, Ga:$SnO_2$ and AZO, or a material such as Ni, Pt, Au, Ag, Ir or a CNT, other than the above-described metal oxide.

In one exemplary aspect, when the light-emitting display device 800 is a top-emission type, a reflective electrode or a reflective layer (not shown) may be disposed under the first electrode 910. For example, the reflective electrode or the reflective layer (not shown) may comprise, but is not limited to, aluminum-palladium-copper (APC) alloy.

In addition, a bank layer 870 is disposed on the passivation layer 860 in order to cover opposite edges of the first electrode 810. The bank layer 870 exposes a center of the first electrode 810 corresponding to the pixel area.

An emission layer 930 is disposed on the first electrode 910. In one exemplary aspect, the emission layer 930 may have a mono-layered structure of an emitting material layer. Alternatively, the emission layer 930 may have a multiple-layered structure of multiple charge transfer layers and an EML as illustrated in FIGS. 9 and 10. As an example, the emission layer 930 may comprise a first charge transfer layer 440 or 540 (See, FIGS. 9 and 10) between the first electrode 910 and the EML 450 or 550 (See, FIGS. 9 and 10) and a second charge transfer layer 460 or 560 (See, FIGS. 9 and 10) between the second electrode 920 and the EML 450 and 550 (See, FIGS. 9 and 10).

The EML may comprise the illuminant 100, 200 or 300 (See, FIGS. 1, 4 and 7). Particularly, the EML may comprise the illuminant 100, 200 or 300 including the inorganic luminescent particle 110, 210 or 310 (See, FIGS. 1, 4 and 7) having at least one metal component "M", "$M_1$" and/or "$M_2$" (See, FIGS. 1, 4 and 7) on the surface thereof, and the ligand 120, 220 or 320 (See, FIGS. 1, 4 and 7) coordinated to the at least one metal component "M", "$M_1$" or "$M_2$". The inorganic luminescent particle 110, 210 and/or 310 (See, FIGS. 1, 4 and 7) may comprise QD or QR.

In an exemplary aspect, the inorganic luminescent particle 110 or 310 (See, FIGS. 1 and 7) may have the heterologous structure of the core 112 or 312 (See, FIGS. 1 and 7) and the shell 114 or 314 (See, FIGS. 1 and 7). The at least one metal component "M" may be on the surface of the shell 114 (See, FIG. 1). In another exemplary aspect, the inorganic luminescent particle 210 (See, FIG. 4) may comprise the core 212 (See, FIG. 4), the shell 214 (See, FIG. 4) enclosing the core 212, and the coating 216 (See, FIG. 4) enclosing the shell 214 and having the at least one metal component "M" may be on the surface thereof (See, FIG. 4). In still another exemplary aspect, mutually different multiple metal components "$M_1$" and "$M_2$" may be on the surface of the shell 314 (See, FIG. 7).

In one exemplary aspect, the EML may comprise the illuminant 100A or 200A (See, FIGS. 2 and 5) emitting red and blue (B) lights and the illuminant 100B or 200B (See, FIGS. 2 and 5) emitting green and blue (B) lights so as to white luminescence.

In another exemplary aspect, the EML 550 may comprise the illuminant 100C or 200C (See, FIGS. 3 and 6) emitting red and green (G) lights and the illuminant 100D or 200D (See, FIGS. 3 and 6) emitting blue and green (G) lights so as to implement white luminescence. In still another exemplary aspect, the EML 550 may comprise the illuminant 300 (See, FIGS. 7 and 8) emitting red, green and blue (B) lights.

The EML may comprise an illuminant 100, 200 or 300 (see, FIGS. 1, 4 and 7), that includes the inorganic luminescent particle 110, 210 or 310 (See, FIGS. 1, 4 and 7) having at least one metal component "M", "$M_1$" and/or "$M_2$" (See, FIGS. 1, 4 and 7) on the surface thereof, and the ligand 120, 220 or 320 (See, FIGS. 1, 4 and 7) coordinated to the at least one metal component "M", "$M_1$" or "$M_2$". The inorganic luminescent particle may comprise QD or QR.

The second electrode 920 is disposed over the substrate 802 above which the emission layer 930 is disposed. The second electrode 920 may be disposed over a whole display area, may comprise a conductive material with a relatively low work function value compared to the first electrode 910, and may be a cathode or an anode. For example, the second electrode 920 may comprise, but is not limited to, Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg.

In addition, an encapsulation film 880 may be disposed over the second electrode 920 in order to prevent outer moisture from penetrating into the light-emitting diode 900. The encapsulation film 880 may have, but is not limited to, a laminated structure of a first inorganic insulating film 882, an organic insulating film 884 and a second inorganic insulating film 886.

Synthesis Example: Synthesis of Inorganic Illuminant

Figure 13A:
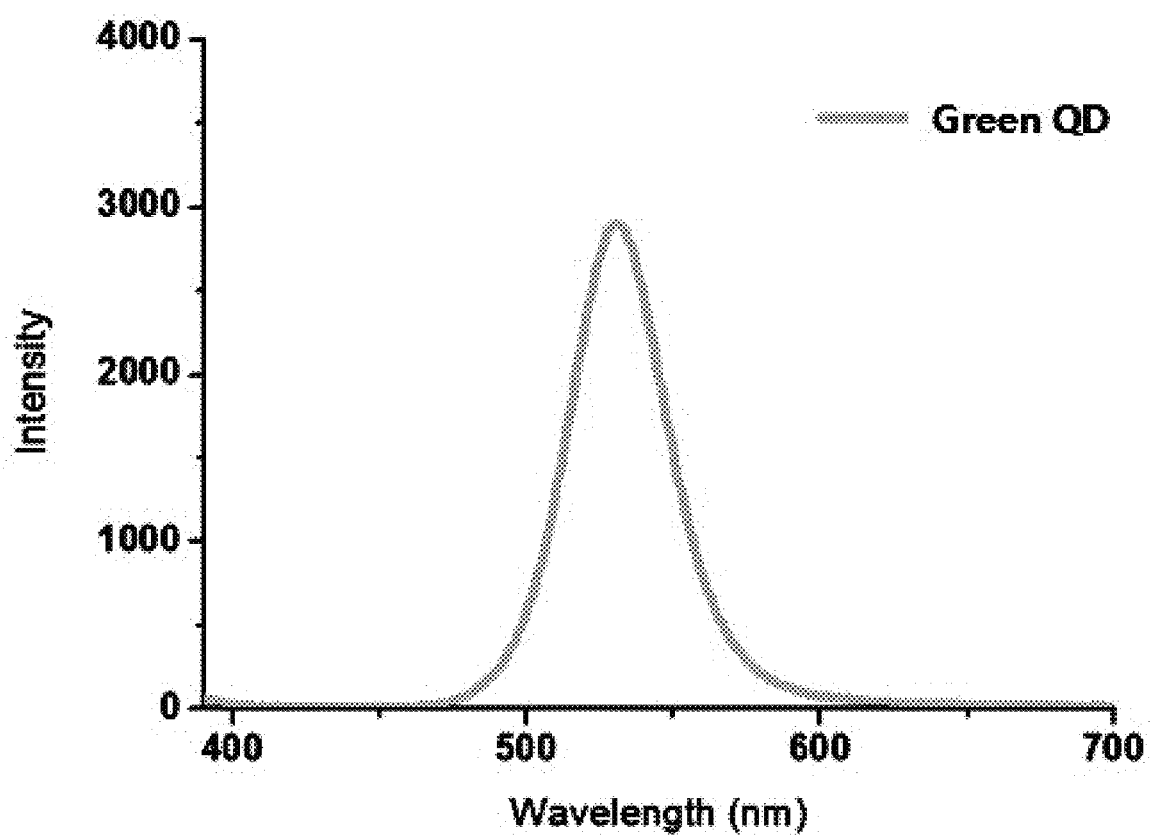
FIGS. 13A to 13D are graph illustrating photoluminescence (PL) spectra of green QD, red QD, 8-hydroxy(iso) quinoline (8-HQ) and an illuminant synthesized by the red/green QDs and 8-HQ.
Figure 13B:
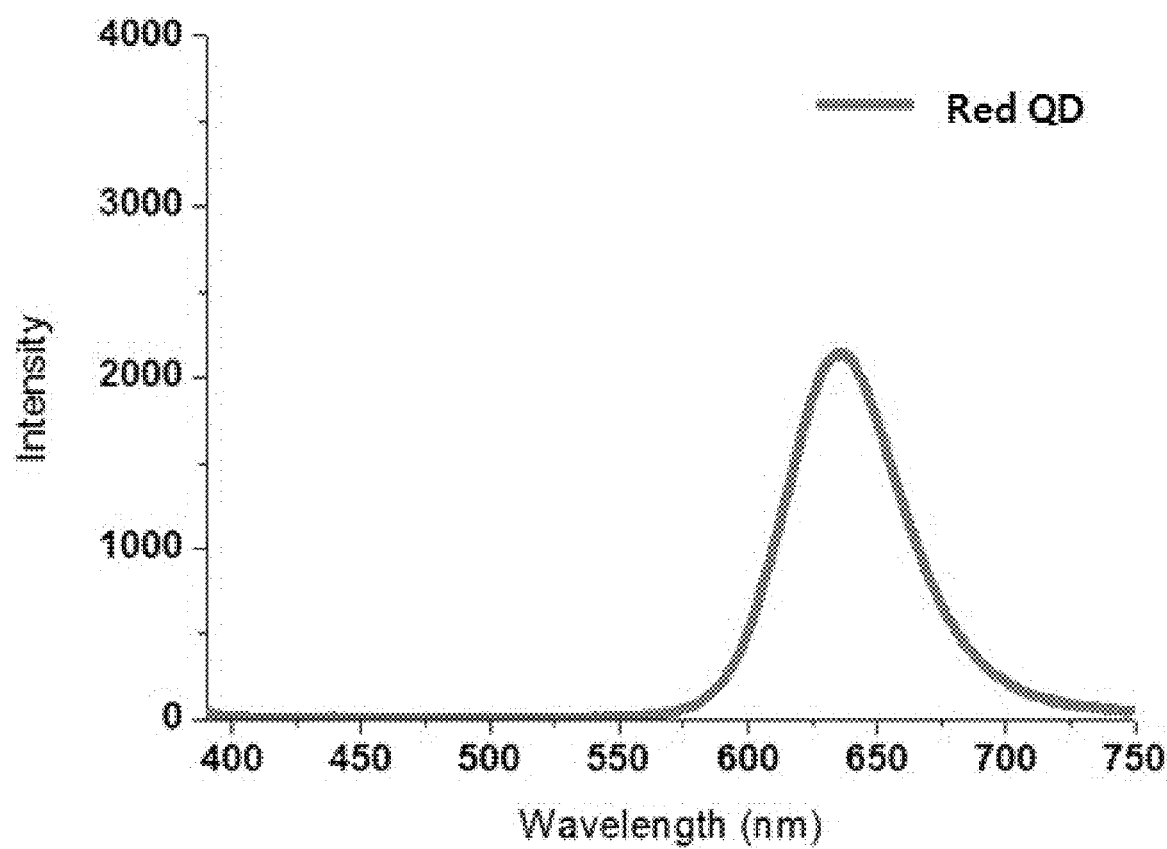
Figure 13C:
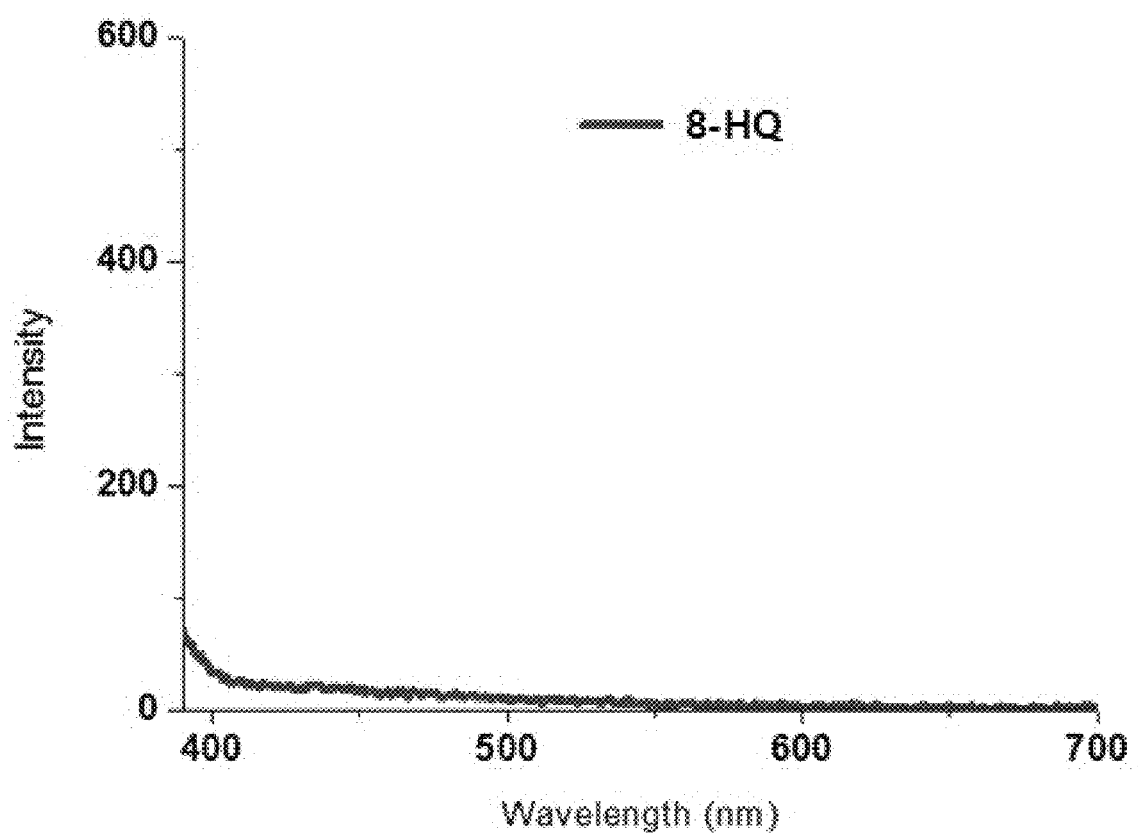

A green QD (InP/ZnSeS) and a red QD (InP/ZnSeS) was prepared as an inorganic luminescent particle. We evaluated luminous properties for each of the green QD and the red QD. The green QD emitted green light and showed a photoluminescence (PL) spectrum corresponding to green light wavelengths (See, FIG. 13A). Besides, the red QD emitted red light and showed a PL spectrum corresponding to red light wavelengths (See, FIG. 13B). Also, 8-hydroxyquinoline (8-HQ) was prepared as a ligand. 8-HQ did not emitted any light and showed a PL spectrum without any luminescent peak (See, FIG. 13C).

0.5 g of the green QD and 0.5 g of the red QD was dispersed in 25 mL octane. We confirmed that the mixture of the green QD and the red QD dispersed in the octane emits yellow light owing to the green QD and the red QD. 0.5 M of 8-HQ was added into the octane solvent in which the mixture luminescent particle of the green QD and the red QD dispersed, and then left overnight at room temperature. The resulting inorganic illuminant forming coordinated bonds between the QDs and 8-HQ was separated from un-reacted QDs and 8-HQ and purified using mixed solvent of toluene and ethanol (2:1) twice.

Example: Photoluminescence (PL) Peak Measurement of Inorganic Illuminant

Figure 13D:
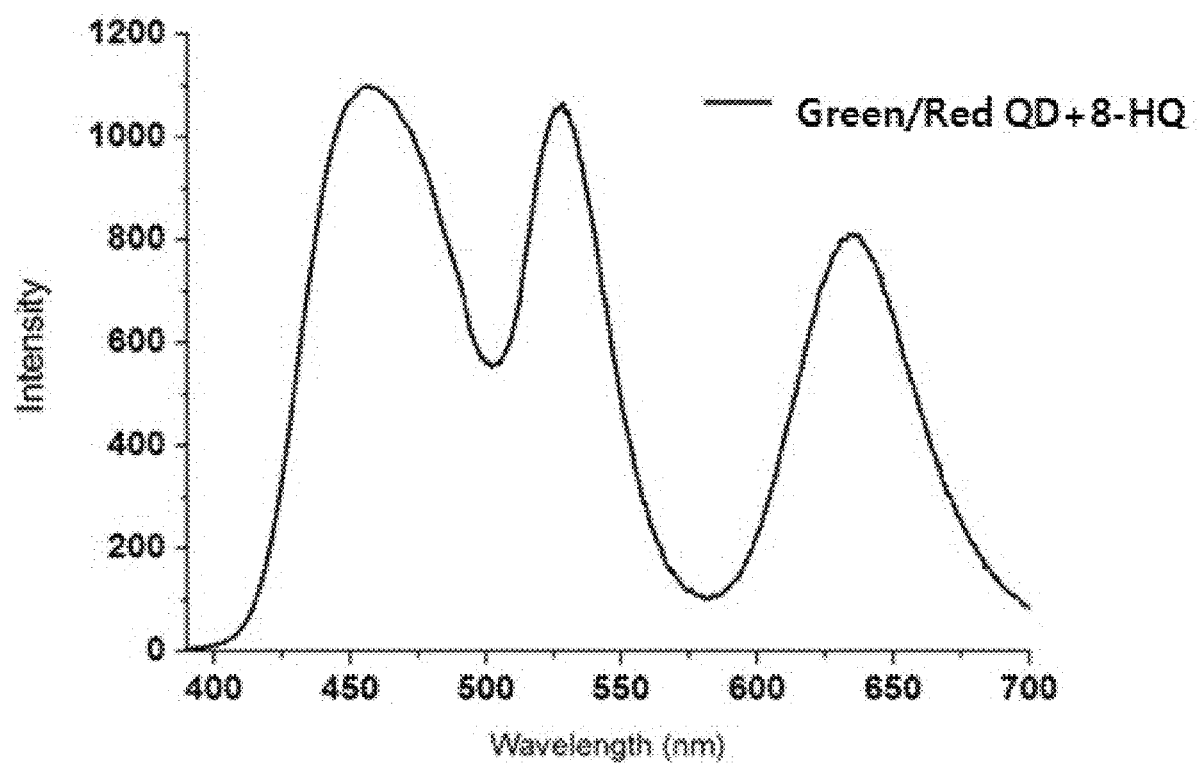

We analyzed luminous properties for the inorganic illuminant in Synthesis Example, which has coordinated bonds between the inorganic luminescent particles, the green QD/red QD, and 8-HQ. The illuminant emitted white light and showed a PL spectrum that emits blue, green and red lights simultaneously (See, FIG. 13D) so as to implement white luminescence.

While the present disclosure has been described with reference to exemplary aspects and examples, these aspects and examples are not intended to limit the scope of the present disclosure. Rather, it will be apparent to those skilled in the art that various modifications and variations can be made in the present disclosure without departing from the spirit or scope of the disclosure. Thus, it is intended that the present disclosure covers the modifications and variations of the present disclosure provided they come within the scope of the appended claims and their equivalents.

The various aspects described above can be combined to provide further aspects. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the aspects can be modified, if necessary to employ concepts of the various patents, applications and publications to provide yet further aspects.

These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. An illuminant comprising:
an inorganic luminescent particle having at least one metal component on a surface thereof; and
an (iso) quinoline-based ligand coordinated to the at least one metal component and having the following Chemical Formula 1:

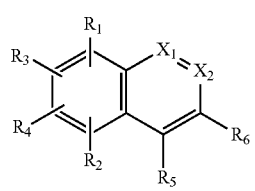

Chemical Formula 1 wherein $R_1$ is selected from the group consisting of hydroxyl group, amino group, $C_1$-$C_{10}$ alkyl amino group and $C_1$-$C_{10}$ alkyl amido group; $R_2$ is selected from the group consisting of protium, deuterium, tritium, $C_1$-$C_{10}$ alkyl group, halogen, nitro group, amino group, $C_1$-$C_{10}$ alkyl amino group, $C_1$-$C_{10}$ alkyl amido group and sulfonyl group; each of $R_3$ to $R_6$ is independently selected from the group consisting of protium, deuterium, tritium and $C_1$-$C_{10}$ alkyl group; one of $X_1$ and $X_2$ is nitrogen (N) and the other of $X_1$ and $X_2$ is $CR_7$, wherein $R_7$ is selected from the group consisting of protium, deuterium, tritium, $C_1$-$C_{10}$ alkyl group, halogen, nitro group, amino group, $C_1$-$C_{10}$ alkyl amino group and $C_1$-$C_{10}$ alkyl amido group.

2. The illuminant of claim 1, wherein the at least one metal component comprises at least one of zinc (Zn), cadmium (Cd), magnesium (Mg), aluminum (Al) and calcium (Ca).

3. The illuminant of claim 1, wherein the ligand coordinated to the at least one metal component has the following Chemical Formula 2:

Chemical Formula 2

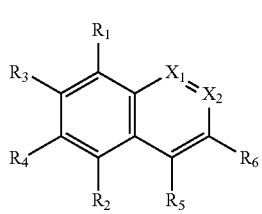

wherein each of $R_1$ to $R_6$, $X_1$ and $X_2$ is identical as defined in Chemical Formula 1.

4. The illuminant of claim 1, wherein the inorganic luminescent particle comprises a core and a shell enclosing the core.

5. The illuminant of claim 4, wherein the ligand is coordinated to the at least one metal component on a surface of the shell.

6. The illuminant of claim 4, wherein the shell comprises an inorganic material selected from the group consisting of Group II-IV compound semiconductor nanocrystals, Group III-V compound semiconductor nanocrystals, metal oxide nanoparticles and combination thereof.

7. The illuminant of claim 4, wherein the shell comprises a first compound including a first metal component selected from at least one of Zn, Mg and Ca and a second compound doped with the first compound and comprising a second metal component elected from at least one of Ca and Al.

8. The illuminant of claim 4, wherein the shell comprises a first compound comprising a first metal component selected from at least one of Ca and Al and a second compound doped with the first compound and comprising a second metal component selected from at least one of Zn, Mg and Cd.

9. The illuminant of claim 4, wherein the inorganic luminescent particle further comprising a coating enclosing the shell.

10. The illuminant of claim 9, wherein the ligand is coordinated to the at least one metal component on a surface of the coating.

11. The illuminant of claim 9, wherein the coating comprises oxide, nitride and halogenide, wherein each of the oxide, the nitride and the halogenide comprises the at least one metal component, respectively.

12. The illuminant of claim 9, wherein the shell comprises an inorganic material selected from the group consisting of Group II-IV compound semiconductor nanocrystals, Group III-V compound semiconductor nanocrystals, Group IV-VI compound semiconductor nanocrystals, Group I-III-VI compound semiconductor nanocrystals, metal oxide nanoparticles and combination thereof.

13. The illuminant of claim 1, wherein the inorganic luminescent particle emits red or green (G) light and a moiety of the at least one metal component coordinated to the ligand emits blue (B) light.

14. The illuminant of claim 1, wherein the inorganic luminescent particle emits red or blue (B) light and a moiety of the at least one metal component coordinated to the ligand emits green (G) light.

15. The illuminant of claim 1, wherein the inorganic luminescent particle emits red (R) light and a moiety of the at least one metal component coordinated to the ligand emits blue or green (G) light.

16. The illuminant of claim 1, wherein the inorganic luminescent particle comprises at least one of quantum dot (QD) or quantum rod (QR).

17. A light-emitting diode, comprising:
a first electrode;
a second electrode facing the first electrode; and
an emitting material layer between the first and second electrodes,
wherein the emitting material layer comprises an illuminant of claim 1.

18. The light-emitting diode of claim 17, wherein the inorganic luminescent particle comprises a red inorganic luminescent particle and a green inorganic luminescent particle, and a moiety of the at least one metal component coordinated to the ligand emits blue (B) light.

19. The light-emitting diode of claim 17, wherein the inorganic luminescent particle comprises a red inorganic luminescent particle and a green inorganic luminescent particle, and a moiety of the at least one metal component coordinated to the ligand emits green (G) light.

20. The light-emitting diode of claim 17, wherein the inorganic luminescent particle comprises a red inorganic luminescent particle and the ligand comprises a first ligand coordinated to a first metal component and a second ligand coordinated to a second metal component, wherein a moiety of the first metal component coordinated to the first ligand emits blue (B) light and a moiety of the second metal component coordinated to the second ligand emits green (G) light.

21. The light-emitting diode of claim 17, wherein the inorganic luminescent particle comprises a red inorganic luminescent particle and the ligand comprises a first ligand coordinated to a first metal component and a second ligand coordinated to a second metal component, wherein a moiety of the first metal component coordinated to the first ligand emits green (G) light and a moiety of the second metal component coordinated to the second ligand emits blue (B) light.

22. A light-emitting device, comprising:
a substrate; and
a light-emitting diode of claim 17 over the substrate.

23. The light-emitting device of claim 22, wherein the device comprises a light-emitting diode illumination device and a light-emitting diode display device.

* * * * *